United States Patent
Iwata

(10) Patent No.: US 10,833,207 B2
(45) Date of Patent: Nov. 10, 2020

(54) PHOTO-DETECTION DEVICE, PHOTO-DETECTION SYSTEM, AND MOBILE APPARATUS

(71) Applicant: CANON KABUSHIKI KAISHA, Tokyo (JP)

(72) Inventor: Junji Iwata, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/385,466

(22) Filed: Apr. 16, 2019

(65) Prior Publication Data

US 2019/0326450 A1 Oct. 24, 2019

(30) Foreign Application Priority Data

Apr. 24, 2018 (JP) .................................. 2018-082796
Feb. 12, 2019 (JP) .................................. 2019-022355

(51) Int. Cl.
| | |
|---|---|
| *H01L 31/02* | (2006.01) |
| *H01L 31/107* | (2006.01) |
| *G01J 1/44* | (2006.01) |
| *H04N 5/374* | (2011.01) |
| *H01L 27/146* | (2006.01) |

(52) U.S. Cl.
CPC .......... *H01L 31/02027* (2013.01); *G01J 1/44* (2013.01); *H01L 27/14643* (2013.01); *H01L 31/107* (2013.01); *H04N 5/374* (2013.01); *G01J 2001/4466* (2013.01)

(58) Field of Classification Search
CPC ............. H01L 31/02027; H01L 31/107; H01L 27/14643; G01J 2001/4466; H04N 5/374; H04N 5/3745
See application file for complete search history.

(56) References Cited

U.S. PATENT DOCUMENTS

| | | | |
|---|---|---|---|
| 8,648,944 B2 | 2/2014 | Iwata | |
| 8,697,500 B2 | 4/2014 | Iwata | |
| 9,543,340 B2 | 1/2017 | Iwata | |
| 9,979,916 B2 | 5/2018 | Hiyama | |
| 10,121,816 B2 | 11/2018 | Iwata | |
| 2008/0283953 A1* | 11/2008 | Itzler | H01L 31/107 257/438 |
| 2011/0136291 A1 | 6/2011 | Iwata | |
| 2015/0053847 A1 | 2/2015 | Furumiya | |
| 2018/0120152 A1* | 5/2018 | Leonardo | H01L 27/1446 |
| 2018/0374886 A1 | 12/2018 | Iwata | |

FOREIGN PATENT DOCUMENTS

JP 2017-117835 6/2017

OTHER PUBLICATIONS

U.S. Appl. No. 16/272,065, filed Feb. 11, 2019, by Daichi Seto et al.

* cited by examiner

*Primary Examiner* — Hsien Ming Lee

(74) *Attorney, Agent, or Firm* — Venable LLP

(57) ABSTRACT

Provided is a photo-detection device including: a plurality of avalanche diodes; a quench element configured to suppress avalanche multiplication in the plurality of avalanche diodes; and a pixel signal processing unit configured to process a signal obtained by summing signals output from respective ones of the plurality of avalanche diodes. The quench element the number of which is one is connected to the plurality of avalanche diode in series.

14 Claims, 19 Drawing Sheets

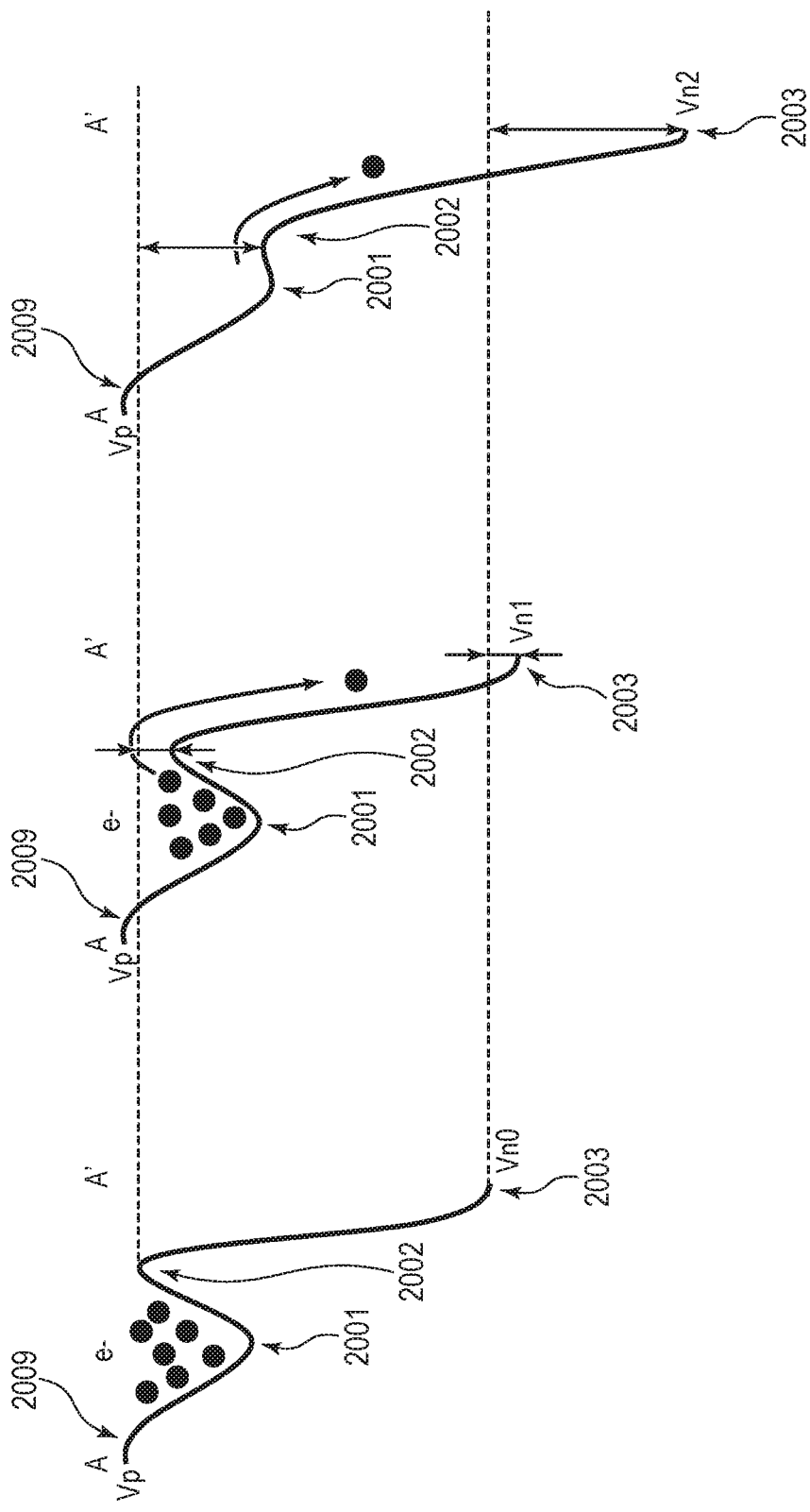

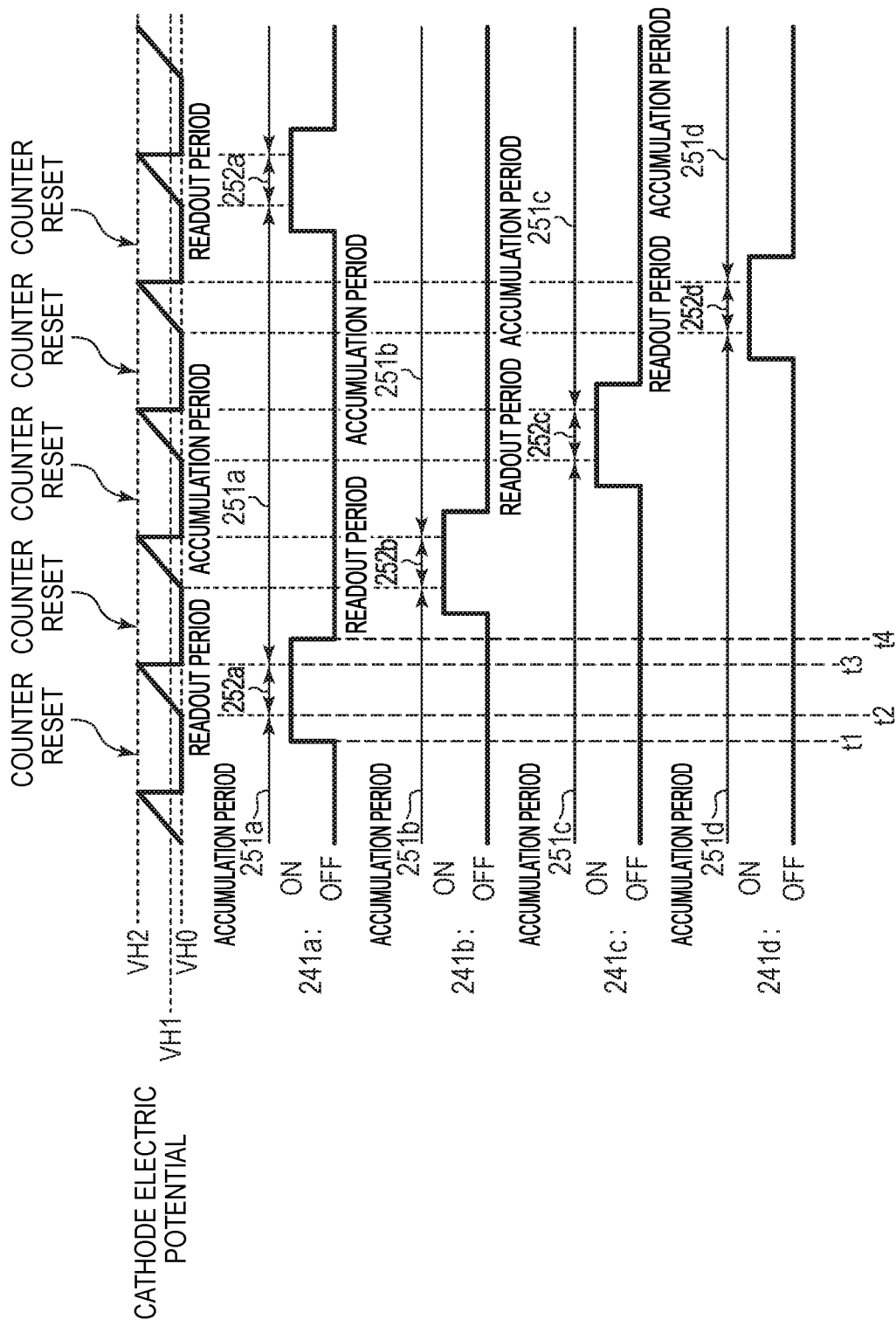

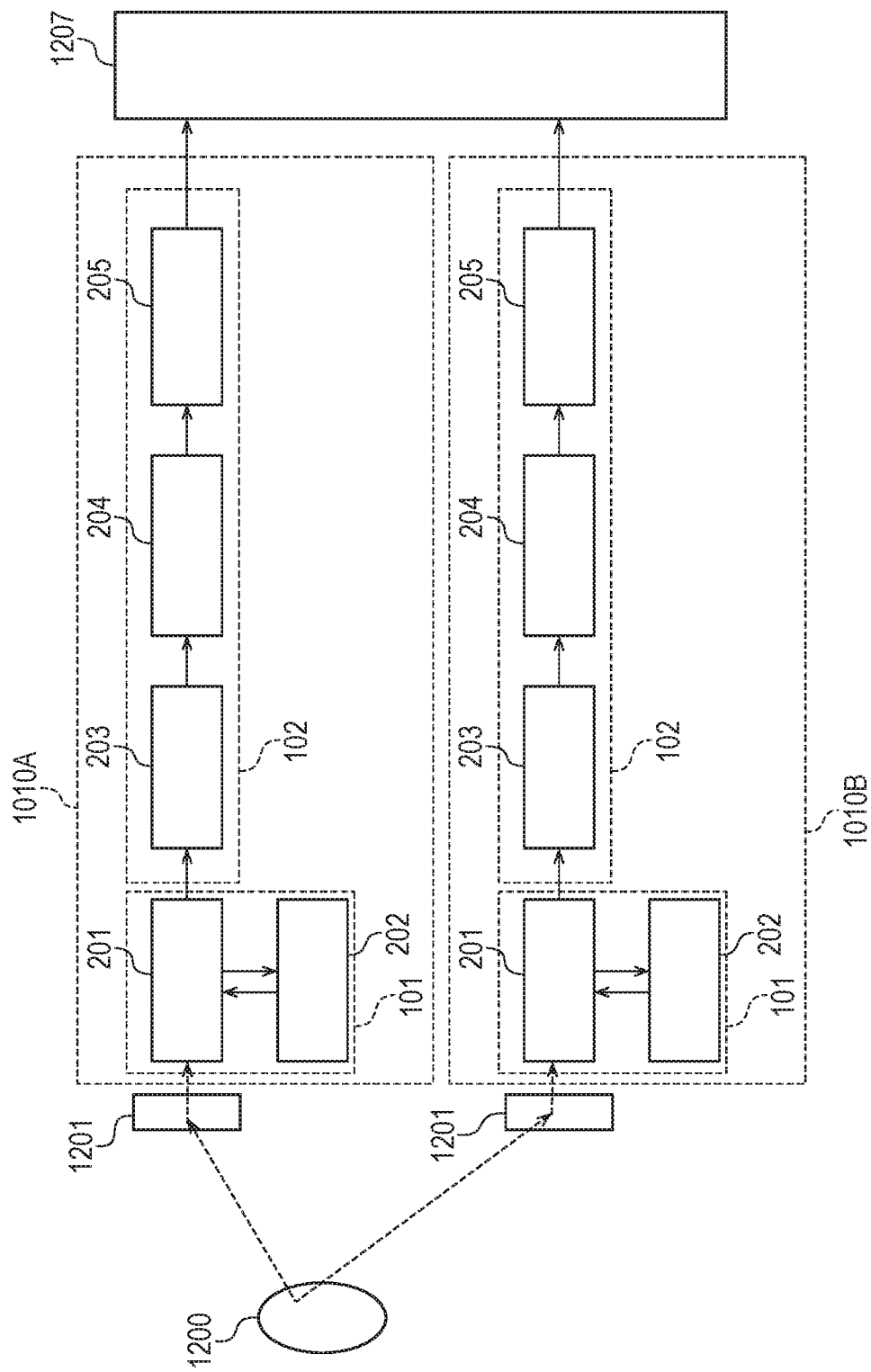

PHOTO-DETECTION DEVICE, PHOTO-DETECTION SYSTEM, AND MOBILE APPARATUS

BACKGROUND OF THE INVENTION

Field of the Invention

The present invention relates to a photo-detection device, a photo-detection system, and a mobile apparatus.

Description of the Related Art

Conventionally, photo-detection devices that can utilize avalanche (electronic avalanche) multiplication and detect a faint light of a single photon level are known. Japanese Patent Application Laid-Open No. 2017-117835 discloses a photoelectric conversion element having a light receiving unit in which pixels including avalanche photodiodes are two-dimensionally arrayed. Output currents from respective pixels are collected simultaneously, and photo-counting is performed. Thereby, the photoelectric conversion element of Japanese Patent Application Laid-Open No. 2017-117835 can measure the amount of a faint incident light. In the photoelectric conversion element of Japanese Patent Application Laid-Open No. 2017-117835, a single quench element is connected in series to a single avalanche photodiode.

In the structure as disclosed in Japanese Patent Application Laid-Open No. 2017-117835, when performance of some of the quench elements is significantly different from that of the remaining quench elements, accuracy of an output signal may be insufficient.

SUMMARY OF THE INVENTION

The present invention intends to provide a photo-detection device having improved accuracy of an output signal.

According to one aspect of the present invention, provided is a photo-detection device including: a plurality of avalanche diodes; a quench element configured to suppress avalanche multiplication in the plurality of avalanche diodes; and a pixel signal processing unit configured to process a signal obtained by summing signals output from respective ones of the plurality of avalanche diodes. The quench element the number of which is one is connected to the plurality of avalanche diode in series.

Further features of the present invention will become apparent from the following description of exemplary embodiments with reference to the attached drawings.

BRIEF DESCRIPTION OF THE DRAWINGS

FIG. 14A, FIG. 14B, and FIG. 14C are potential diagrams of the photoelectric conversion unit according to the sixth embodiment.

FIG. 16 is a timing chart illustrating a drive method of the photoelectric conversion element according to the sixth embodiment.

FIG. 17 is a block diagram of a photo-detection system according to a seventh embodiment.

DESCRIPTION OF THE EMBODIMENTS

Preferred embodiments of the present invention will now be described in detail in accordance with the accompanying drawings. Corresponding components throughout a plurality of drawings are labeled with common reference, and the description thereof may be omitted or simplified.

First Embodiment

Figure 1:
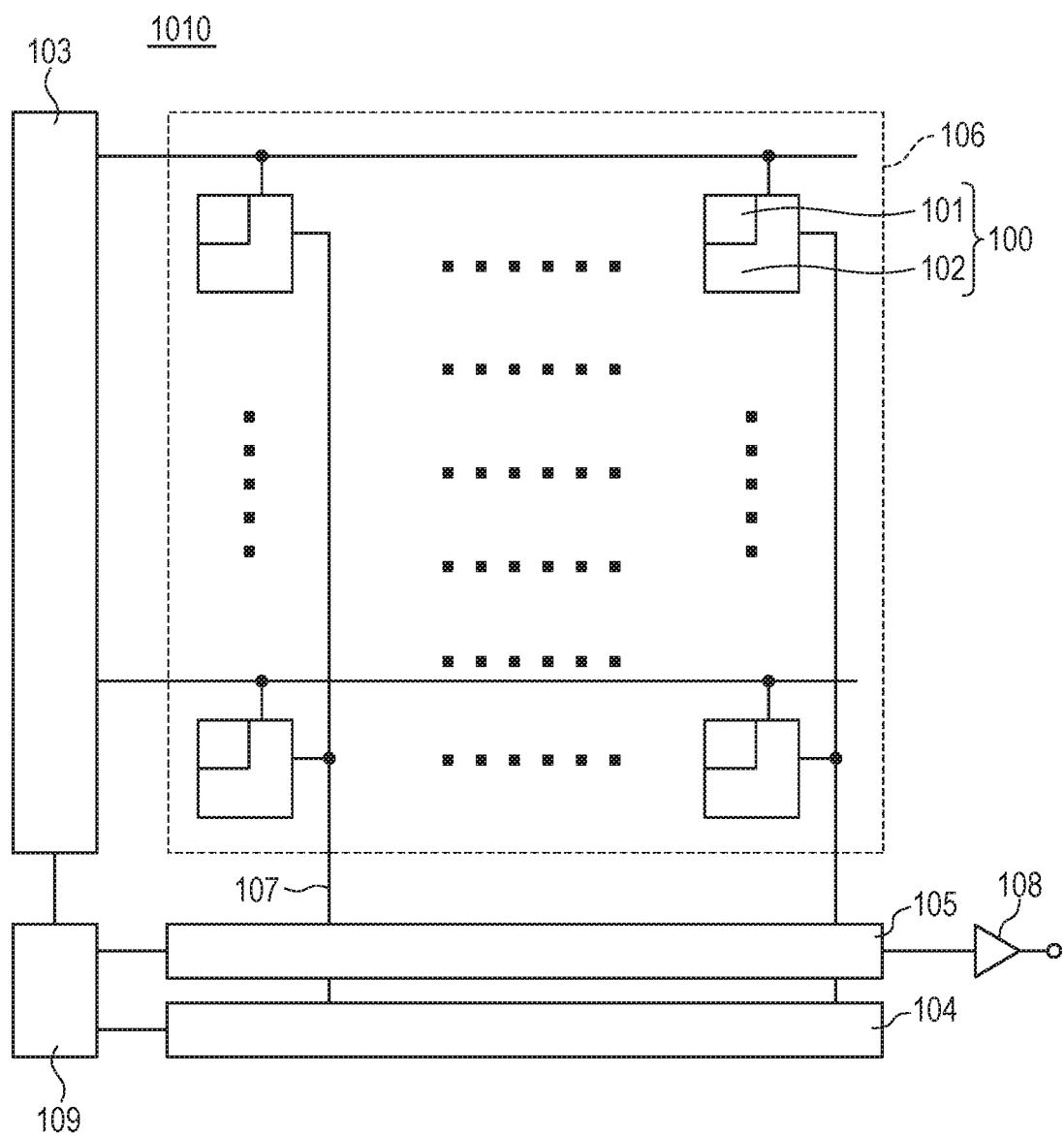
FIG. 1 is a block diagram illustrating a general configuration of a photo-detection device according to a first embodiment.

A photo-detection device according to a first embodiment will be described with reference to FIG. 1 to FIG. 8B. FIG. 1 is a block diagram illustrating a general configuration of a photo-detection device 1010 according to the present embodiment. The photo-detection device 1010 has a vertical scanning circuit unit 103, a horizontal scanning circuit unit 104, a column circuit 105, a pixel unit 106, signal lines 107, an output circuit 108, and a control pulse generation unit 109.

The pixel unit 106 has a plurality of pixels 100 arranged in a matrix. Each of the pixels 100 includes a photoelectric conversion element 101 and a pixel signal processing unit 102. The photoelectric conversion element 101 photoelectrically converts an incident light into an electric signal. The pixel signal processing unit 102 outputs the converted electrical signal to the column circuit 105.

Note that, in the present specification, "light" may include electromagnetic waves having any wavelength. That is, "light" is not limited to a visible light and may include an invisible light such as an infrared ray, an ultraviolet ray, an X ray, a gamma ray, or the like.

The control pulse generation unit 109 generates control pulses that drive the vertical scanning circuit unit 103, the horizontal scanning circuit unit 104, and the column circuit 105 and supplies the control pulses to these units. Thereby, the control pulse generation unit 109 controls a drive timing or the like of each unit.

The vertical scanning circuit unit 103 supplies a control pulse to each of the plurality of pixels 100 based on the control pulse supplied from the control pulse generation unit 109. As illustrated in FIG. 1, the vertical scanning circuit unit 103 supplies control pulses on a row basis to respective pixels 100 via drive lines provided on a row basis of the pixel unit 106. Logic circuits such as a shift resistor, an address decoder, or the like may be used in the vertical scanning circuit unit 103.

The signal lines 107 provided on a column basis of the pixel unit 106 transmits, to the column circuit 105 provided on the post-stage of the pixels 100, signals output from the pixels 100 on the row selected by the vertical scanning circuit unit 103 as electric potential signals. The column circuit 105 performs a predetermined process on signals input via the signal lines 107 from respective pixels 100. For example, a predetermined process is a process such as noise removal, amplification, conversion of an output form, or the like of the input signal. To implement these functions, the column circuit 105 may have a parallel-to-serial conversion circuit or the like.

The horizontal scanning circuit unit 104 supplies, to the column circuit 105, control pulses used for sequentially outputting signals on which a predetermined process has been performed to the output circuit 108 based on the control pulses supplied from the control pulse generation unit 109. The output circuit 108 includes a buffer amplifier, a differential amplifier, or the like and outputs a signal output from the column circuit 105 to a storage unit or a signal processing unit outside the photo-detection device 1010.

In FIG. 1, the arrangement of the pixels 100 within the pixel unit 106 may be one-dimensional, or only one pixel 100 may be provided. When the pixels 100 within the pixel unit 106 are divided into some blocks, a plurality of vertical scanning circuit units 103, a plurality of horizontal scanning circuit units 104, and a plurality of column circuits 105 may be arranged for each of the blocks. Further, the horizontal scanning circuit unit 104 and the column circuit 105 may be arranged on a column basis.

It is not essential that the pixel signal processing unit 102 be provided in all the pixels 100 one by one. For example, a single pixel signal processing unit 102 may be shared by a plurality of pixels 100. In such a case, the pixel signal processing unit 102 provides a function of signal processing to each pixel by sequentially processing signals output from respective photoelectric conversion elements 101.

Further, the pixel signal processing units 102 may be provided on a semiconductor substrate different from a semiconductor substrate on which the photoelectric conversion elements 101 are provided. In such a case, it is possible to improve sensitivity by improving a ratio of the area (opening ratio) of the photoelectric conversion elements 101 where a light can be received. In such a case, the photoelectric conversion elements 101 and the pixel signal processing units 102 are electrically connected to each other via connection wirings provided for each of the pixels 100. Furthermore, the vertical scanning circuit unit 103, the horizontal scanning circuit unit 104, the column circuit 105, and the signal lines 107 may also be provided on a semiconductor substrate that is different from the semiconductor substrate on which the photoelectric conversion elements 101 are provided as with the pixel signal processing unit 102.

Figure 2:
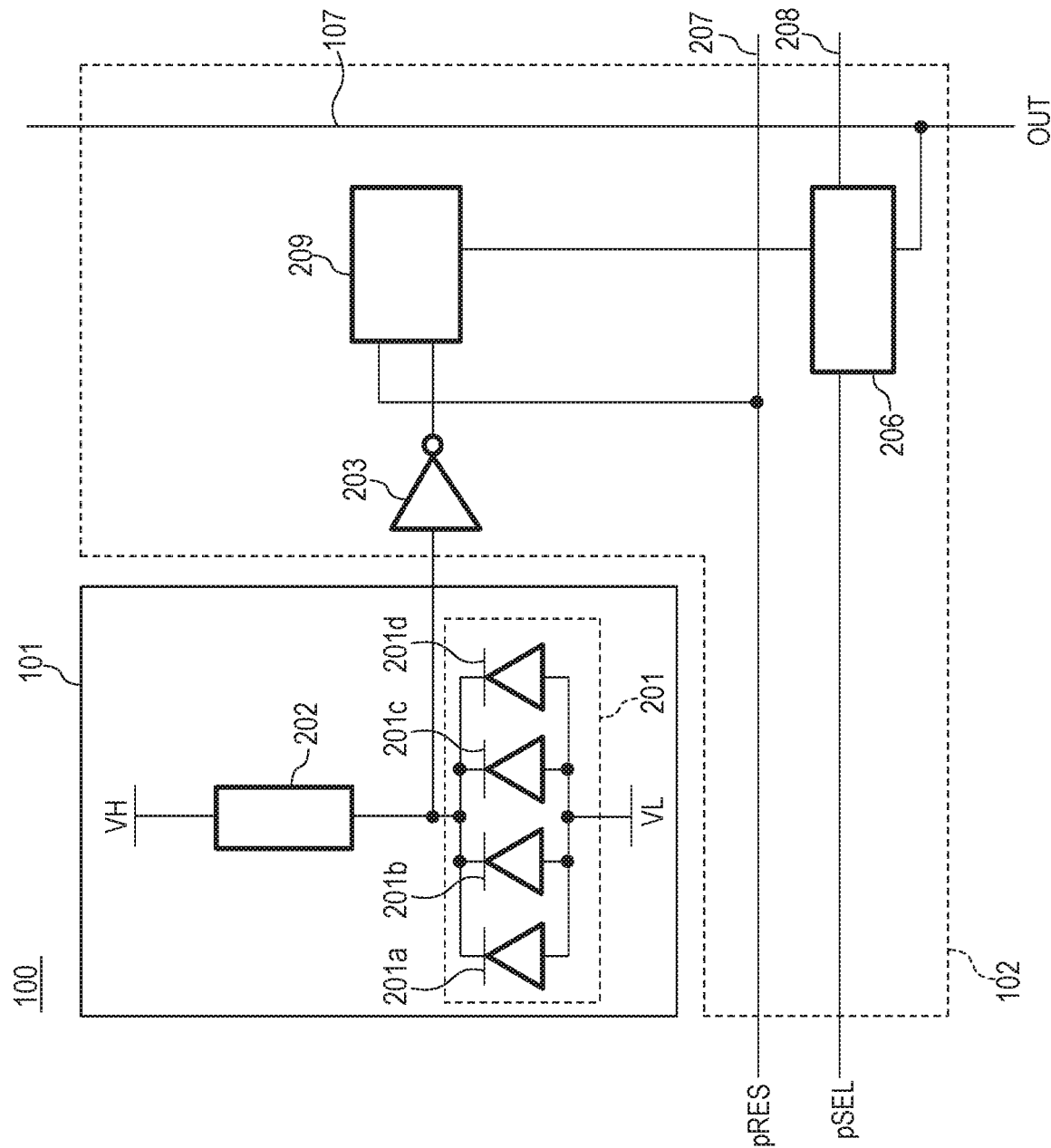
FIG. 2 is a circuit diagram illustrating a configuration example of a pixel according to the first embodiment.

FIG. 2 is a circuit diagram illustrating a configuration example of the pixel 100 according to the present embodiment. The pixel 100 has the photoelectric conversion element 101 and the pixel signal processing unit 102. The photoelectric conversion element 101 has four photoelectric conversion units 201a, 201b, 201c, and 201d and a quench element 202. The four photoelectric conversion units 201a, 201b, 201c, and 201d are connected to each other in parallel. Note that the number of photoelectric conversion units included in one pixel 100 is not limited to four and may be any number as long as it is plural. Further, in the following description, the four photoelectric conversion units 201a, 201b, 201c, and 201d may be collectively referred to as a photoelectric conversion unit 201.

The photoelectric conversion units 201a to 201d generate charge pairs in accordance with an incident light caused by photoelectric conversion. An avalanche diode is used for each of the photoelectric conversion units 201a to 201d. An electric potential VL is supplied to the anodes of the photoelectric conversion units 201a to 201d. The cathodes of the photoelectric conversion units 201a to 201d are connected to one end of the quench element 202. An electric potential VH that is higher than the electric potential VL is supplied to the other end of the quench element 202.

A reverse bias electric potential which may cause avalanche multiplication on charges generated in the photoelectric conversion units 201a to 201d is supplied between the anodes and the cathodes of the photoelectric conversion units 201a to 201d. Once charges generated by an incident light pass through the avalanche multiplication region in a state where such a reverse bias electric potential difference is supplied, an avalanche current occurs.

Note that, when a reverse bias electric potential difference is supplied, when the electric potential difference between the anode and the cathode is larger than a breakdown voltage of an avalanche diode, the avalanche diode operates in a Geiger mode. A photodiode that detects a faint signal at a single photon level at a high speed in a Geiger mode is called an SPAD.

Further, when the electric potential difference between the anode and the cathode of the photoelectric conversion units 201a to 201d is greater than or equal to an electric potential difference which causes avalanche multiplication to occur on charges generated in the photoelectric conversion units 201a to 201d and less than or equal to the breakdown voltage, the avalanche diode operates in a linear mode. An avalanche diode that performs photo-detection in a linear mode is called an avalanche photodiode (APD). In the present embodiment, the photoelectric conversion units 201a to 201d may operate as avalanche diodes of the SPAD or the APD.

The quench element 202 has a function of replacing a change in avalanche currents generated in the photoelectric conversion units 201a to 201d with a voltage signal. Furthermore, the quench element 202 functions as a load circuit (a quench circuit) at signal amplification by avalanche multiplication and has a function of suppressing avalanche multiplication by suppressing a voltage supplied to the photoelectric conversion units 201a to 201d (a quench operation). A specific example of a circuit element forming the quench element 202 may be a resistor element or an active quench circuit. The active quench circuit detects an increase in the avalanche current and performs feedback control to actively control avalanche multiplication.

The pixel signal processing unit 102 has a waveform shaping unit 203, a select circuit 206, and a counter circuit 209. The waveform shaping unit 203 shapes a voltage change when a signal voltage of a single photon level is input from the photoelectric conversion element 101 and outputs a pulse signal. A specific example of a circuit element forming the waveform shaping unit 203 may be an inverter circuit. While FIG. 2 illustrates the circuit configuration in which a single inverter circuit is provided as the waveform shaping unit 203, other circuits may be used as long as they have a waveform shaping effect. For example, the waveform shaping unit 203 may be a circuit in which a plurality of inverter circuits are connected in series.

The counter circuit 209 counts the number of pulses of a pulse signal output from the waveform shaping unit 203. The counter circuit 209 may be an N-bit counter (N is a positive integer), for example. In such a case, the counter circuit 209 can count the number of pulses up to around N-th power of 2. The count number is held in the counter circuit 209 as a detection signal. Further, a control pulse pRES may be supplied to the counter circuit 209 from the vertical scanning circuit unit 103 illustrated in FIG. 1 via the drive line 207. Once the control pulse pRES is supplied to the counter circuit 209, the count number that has been held is reset.

The select circuit 206 switches the electrical connection/disconnection state between the counter circuit 209 and the signal line 107. A control pulse pSEL is supplied from the vertical scanning circuit unit 103 illustrated in FIG. 1 to the select circuit 206 via a drive line 208. When the control pulse pSEL is supplied to the select circuit 206, the electrical connection/disconnection state between the counter circuit 209 and the signal line 107 is switched in accordance with the level of the control pulse pSEL. The select circuit 206 may include a transistor, a buffer circuit used for outputting a signal to the outside of the pixel 100, or the like, for example. When the counter circuit 209 and the signal line 107 are electrically connected, a digital signal that indicates a count value of the detection signals held in the counter circuit 209 is transmitted to the signal line 107.

Note that, instead of the select circuit 206, a switch such as a transistor may be provided to a node between the quench element 202 and the photoelectric conversion units 201a to 201d, a node between the photoelectric conversion element 101 and the pixel signal processing unit 102, or the like. In such a case, the same function as that of the select circuit 206 can also be implemented by switching the connection/disconnection state of the switch. Similarly, the same function as that of the select circuit 206 can also be implemented by switching the presence/absence of an electric potential supplied to the quench element 202 or the photoelectric conversion element 101 by using a switch such as a transistor.

Each pixel 100 in the pixel unit 106 can be driven by a rolling shutter operation or a global electronic shutter operation. A signal acquired from each pixel 100 may be used for generation of an image based on a light entering the pixel unit 106.

The rolling shutter operation is an operation of performing reset of the count value in the counter circuit 209 and output of the signal from the counter circuit 209 sequentially on a row basis at different timings. The global electronic shutter operation is an operation of performing reset of the counts in the counter circuits 209 simultaneously on all the rows and then outputting the signals held in the counter circuits 209 sequentially on a row basis.

Note that, when performing the global electronic shutter operation, in order to set the time for counting pulses to be the same on each row, it is preferable that an element that switches whether or not to perform the count of the counter circuit 209 be further added. The element that switches whether or not to perform the count may be, for example, a switch such as a transistor.

Further, instead of the counter circuit 209, a Time to Digital Converter circuit (hereafter, referred to as TDC) and a memory may be provided. In such a case, the photodetection device 1010 can acquire a timing when a pulse is detected.

In this modified example, a generation timing of the pulse signal output from the waveform shaping unit 203 is converted into a digital signal by the TDC. The control pulse pREF as a reference signal used for measuring the timing of the pulse signal is supplied to the TDC from the vertical scanning circuit unit 103 via a drive line. The TDC acquires a digital signal corresponding to the time when the pulse is input from the waveform shaping unit 203 by using the control pulse pRES as a time reference.

The circuit of the TDC may use a Delay Line scheme that forms a delay circuit by using delay lines in which buffer circuits are connected in series, a Looped TDC scheme that uses a circuit in which delay lines are connected in a loop shape, or the like, for example. While another scheme may be used for the TDC circuit, the scheme preferably is capable of achieving a time resolution that is higher than or equal to the time resolution of the photoelectric conversion units 201a to 201d in order to ensure sufficient time resolution.

A digital signal acquired by the TDC is held in one or a plurality of memories. When the number of memories is plural, it is possible to selectively output a signal from any one of the plurality of memories to the signal line 107 by supplying a plurality of control pulses pSEL to the select circuit 206.

Figure 3A:
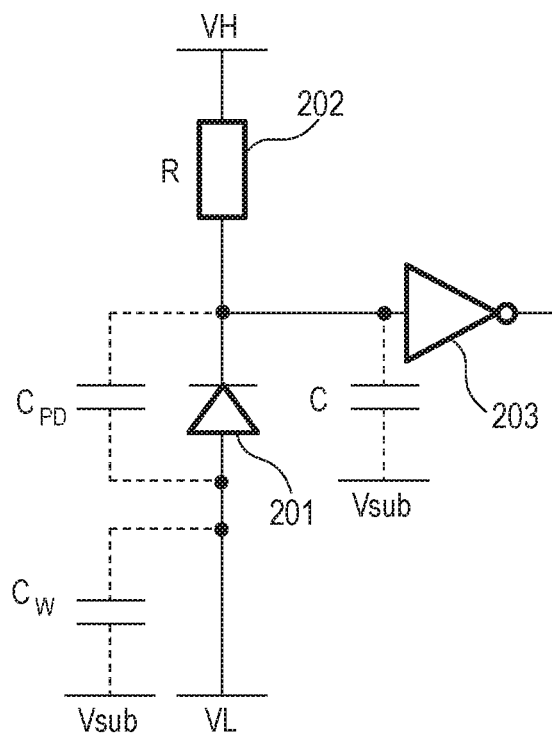
FIG. 3A, FIG. 3B, and FIG. 3C are circuit diagrams illustrating a configuration example of a quench element according to the first embodiment.
Figure 3B:
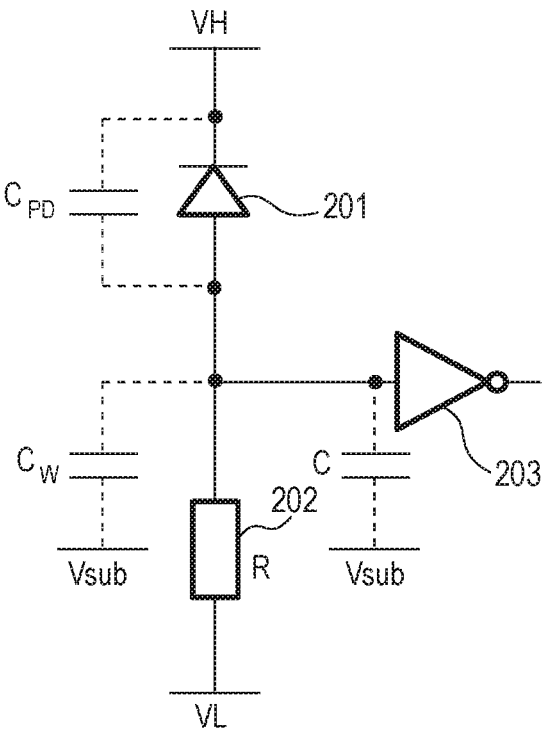
Figure 3C:
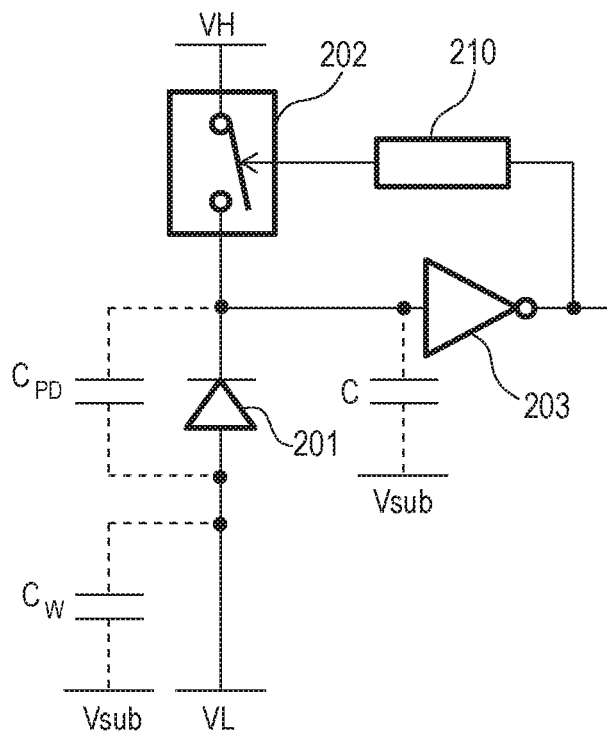

FIG. 3A, FIG. 3B, and FIG. 3C are circuit diagrams illustrating some configuration examples of the quench element 202. FIG. 3A is a circuit diagram illustrating a configuration example in which a resistor element having a resistance R as the quench element 202 is arranged on the cathodes side of the photoelectric conversion unit 201. Since the connection relationship between the photoelectric conversion unit 201, the quench element 202, and the waveform shaping unit 203 is the same as that in FIG. 2, the description thereof will be omitted. Further, FIG. 3A illustrates a PN junction capacitor CPD of the photoelectric conversion unit 201, a well capacitor Cw of the photoelectric conversion unit 201, and a parasitic capacitor C of a wiring and a diffusion layer. The reference Vsub illustrated in FIG. 3A denotes a substrate electric potential.

The PN junction capacitor CPD of the photoelectric conversion unit 201 is a capacitor in a detection region where a strong electric field is induced for generating avalanche multiplication. Thus, the PN junction capacitor CPD is proportional to the area of the detection region.

In the configuration of FIG. 3A, it requires a certain time period from the time when an input electric potential of the waveform shaping unit 203 changes due to an avalanche current to the time when a bias of the photoelectric conversion unit 201 returns to the initial state due to a voltage drop by the quench element 202. The time period from the time when the photoelectric conversion element 101 once detects charges to the time when the photoelectric conversion element 101 returns to a state of being able to detect charges next is referred to as a dead time. A shorter dead time results in the increased number of charges that can be counted in unit time and the wider dynamic range of the photo-detection device 1010.

The dead time $\tau_d$ of the photoelectric conversion element 101 in the configuration example of FIG. 3A can be calculated from the following equation (1).

$$\tau_d = R(C_{pd} + C) \quad (1)$$

FIG. 3B is a circuit diagram illustrating a configuration example in which a resistor element having a resistance R as the quench element 202 is arranged on the anodes side of the photoelectric conversion unit 201. In the present example, the electric potential VH is supplied to the cathode of the photoelectric conversion unit 201. The anode of the photoelectric conversion unit 201 is connected to one end of the quench element 202. An electric potential VL that is lower than the electric potential VH is supplied to the other end of the quench element 202.

The dead time $\tau_d$ of the photoelectric conversion element 101 in the configuration example of FIG. 3B can be calculated from the following equation (2).

$$\tau_d = R(C_{pd} + C_w + C) \quad (2)$$

FIG. 3C is a circuit diagram illustrating a configuration example in which a switch is arranged as the quench element 202 on the cathode side of the photoelectric conversion unit 201. The quench element 202 is configured to be controlled to be turned on or turned off by a quench element control unit 210. The quench element control unit 210 delays and outputs the pulse output from the waveform shaping unit 203. Thereby, the quench element control unit 210 is configured to control the quench element 202 to be turned off immediately after occurrence of avalanche multiplication. According to the present configuration example, by a quench operation being actively performed, the dead time can be shortened compared to a case where a passive element is used for the quench element 202.

Figure 4A:
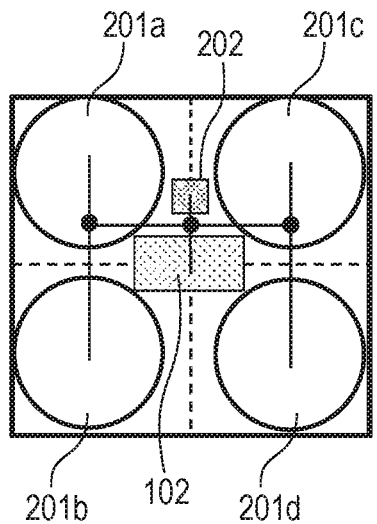
FIG. 4A and FIG. 4B are diagrams illustrating a configuration example of the photoelectric conversion element according to the first embodiment.
Figure 4B:
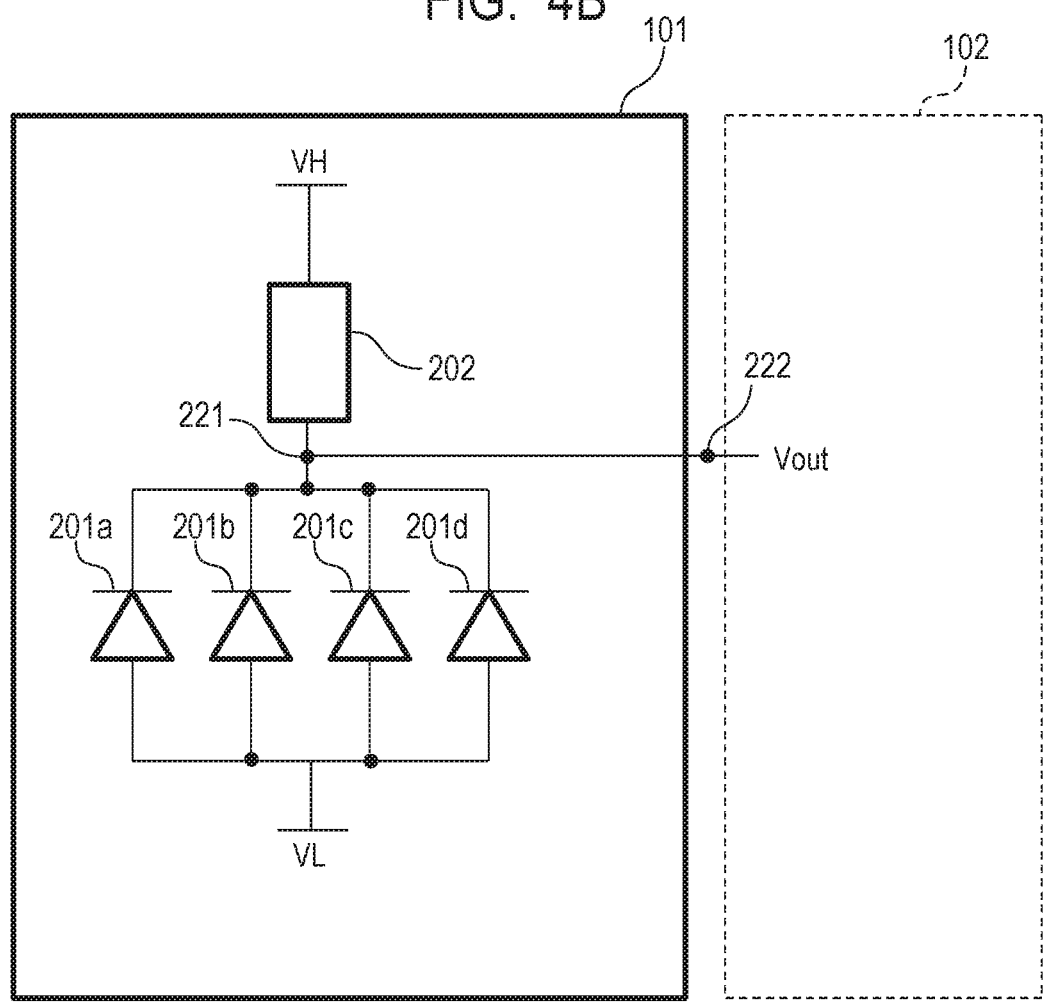

FIG. 4A and FIG. 4B are diagrams illustrating a configuration example of the photoelectric conversion element 101 according to the present embodiment. FIG. 4A is a schematic diagram in a plan view from a direction perpendicular to the semiconductor substrate on which the photoelectric conversion element 101 and the pixel signal processing unit 102 are formed. FIG. 4B is a circuit diagram of the photoelectric conversion element 101.

As illustrated in FIG. 4A, four photoelectric conversion units 201a, 201b, 201c, and 201d are provided in one pixels 100. The four photoelectric conversion units 201a, 201b, 201c, and 201d are arranged in a matrix of two rows and two columns. The pixel signal processing unit 102 is arranged at or near the center of the four photoelectric conversion units 201a, 201b, 201c, and 201d. The quench element 202 is arranged between the two photoelectric conversion units 201a and 201c.

In such a way, in the present embodiment, the four photoelectric conversion units 201a, 201b, 201c, and 201d, the pixel signal processing unit 102, and the quench element 202 are formed on the same face of the same semiconductor substrate. Thereby, manufacturing cost can be reduced compared to a case where these elements are formed on different substrates. This effect of reduction in area is greater when the quench element 202 is an active quench circuit as illustrated in FIG. 3C than when the quench element 202 is a passive element such as a resistor element. This is because the element area of an active quench circuit is larger than that of a passive element in general.

As illustrated in FIG. 4B, one quench element 202 is connected in series to the four photoelectric conversion units 201a, 201b, 201c, and 201d. Wirings extending from the cathodes of the four photoelectric conversion units 201a, 201b, 201c, and 201d are bundled into one at the node 221 where the quench element 202 and the photoelectric conversion units 201a, 201b, 201c, and 201d are connected.

Figure 5A:
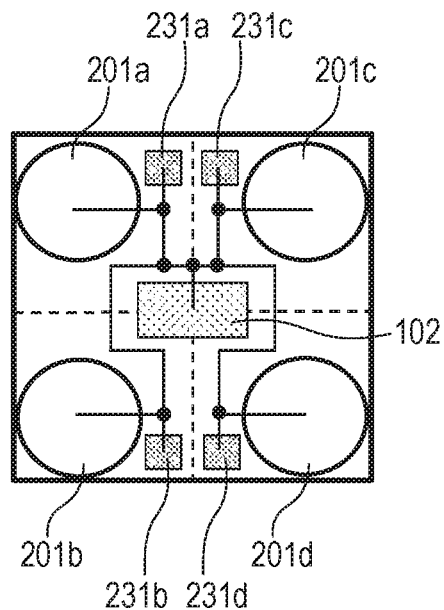
FIG. 5A and FIG. 5B are diagrams illustrating a configuration example of a photoelectric conversion element according to a comparative example according to the first embodiment.
Figure 5B:
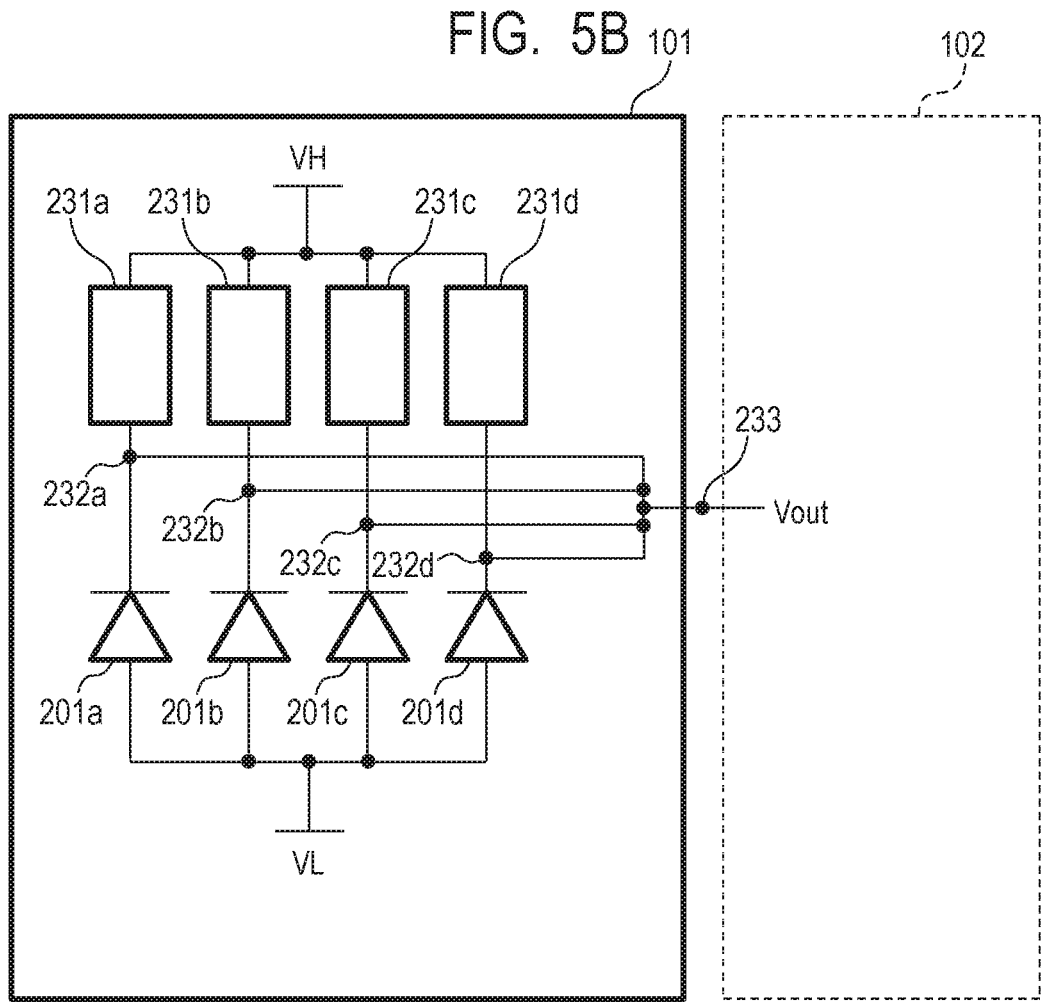

FIG. 5A and FIG. 5B are diagrams illustrating a configuration example of the photoelectric conversion element 101 according to a comparative example of the present embodiment. FIG. 5A is a schematic diagram in a plan view from a direction perpendicular to the semiconductor substrate on which the photoelectric conversion element 10 and the pixel signal processing unit 102 are formed. FIG. 5B is a circuit diagram of the photoelectric conversion element 101.

The comparative example illustrated in FIG. 5A and FIG. 5B is different from the example illustrated in FIG. 4A and FIG. 4B in that the four quench elements 231a, 231b, 231c, and 231d are provided. The four quench elements 231a, 231b, 231c, and 231d are provided so as to correspond to the four photoelectric conversion elements 201a, 201b, 201c, and 201d, respectively. The four quench elements 231a, 231b, 231c, and 231d are connected in series to the four photoelectric conversion units 201a, 201b, 201c, and 201d, respectively.

In the configuration of the present embodiment illustrated in FIG. 4A and FIG. 4B, the single quench element 202 is shared by and connected in series to the four photoelectric conversion units 201a, 201b, 201c, and 201d. Thereby, it is possible to reduce an influence on accuracy of an output signal due to variation in performance of the quench elements 231a, 231b, 231c, and 231d that may occur in the comparative example illustrated in FIG. 5A and FIG. 5B. This effect will be described in more detail with reference to FIG. 6A, FIG. 6B, FIG. 7A, FIG. 7B, FIG. 8A, and FIG. 8B.

Figure 6A:
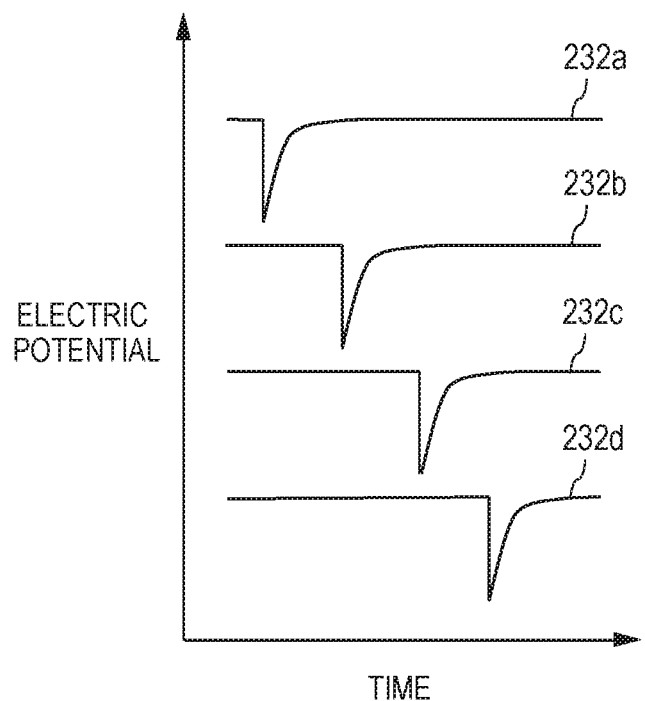
FIG. 6A and FIG. 6B are graphs illustrating an electric potential of each node in the comparative example of the first embodiment.
Figure 6B:
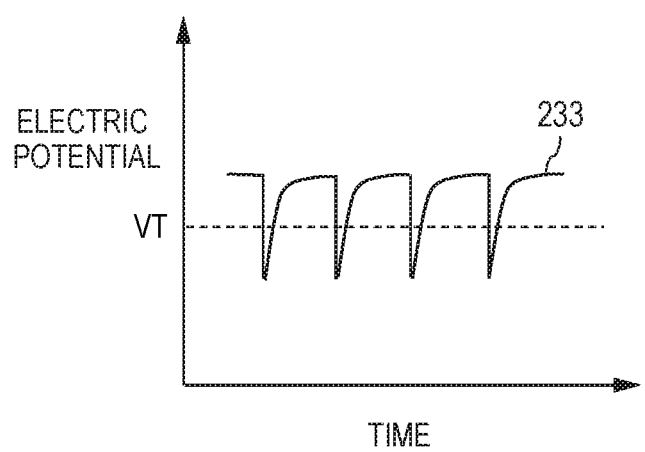

FIG. 6A and FIG. 6B are graphs illustrating the electric potential of each node in the comparative example of the present embodiment. The horizontal axis of each graph represents time, and the vertical axis thereof represents the electric potential. Note that, in the present specification, the unit for axes of each graph is arbitrary, and scales are not the same between graphs. FIG. 6A is a graph illustrating the change of the electric potential of the nodes 232a, 232b, 232c, and 232d when a single photon enters each of the four photoelectric conversion units 201a, 201b, 201c, and 201d at different timings. Respective graphs of the nodes 232a, 232b, 232c, and 232d are shifted in the vertical direction so as not to overlap each other in illustration. FIG. 6A illustrates that the electric potential of each node decreases at the timing when a photon enters each photoelectric conversion unit and then returns to the original electric potential by the quench operation after a predetermined time period (dead time) has elapsed.

FIG. 6B is a graph illustrating a change of the electric potential of the node 233 when each photon enters the four photoelectric conversion units 201a, 201b, 201c, and 201d at the timing illustrated in FIG. 6A. Since one photon enters each of the four photoelectric conversion units 201a, 201b, 201c, and 201d, the electric potential of the node 233, which is the electric potential of the arithmetic mean thereof, falls for four times.

The dashed line in FIG. 6B indicates the electric potential level of a logic determination threshold VT when electric potential changes are counted in the pixel signal processing unit 102. The counter circuit 209 counts the number of times that the electric potential changes and crosses over the logic determination threshold VT from a state of being higher than the logic determination threshold VT to a state of being lower than the logic determination threshold VT. Since the number of times that the electric potential of the node 233 becomes below the logic determination threshold VT is four, the count number counted by the counter circuit 209 is four. This count number matches the total number of incident photons, and thus a correct value is output from the pixel signal processing unit 102.

Figure 7A:
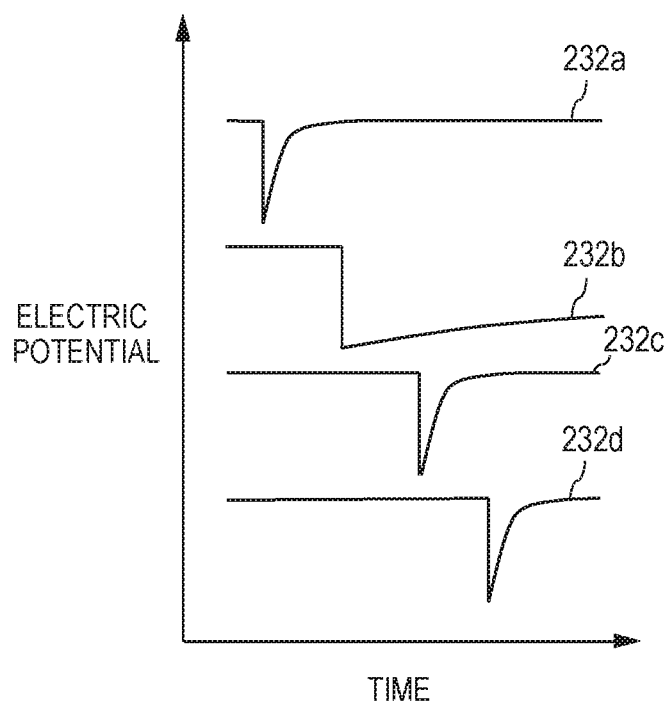
FIG. 7A and FIG. 7B are graphs illustrating an electric potential of each node in the comparative example of the first embodiment.
Figure 7B:
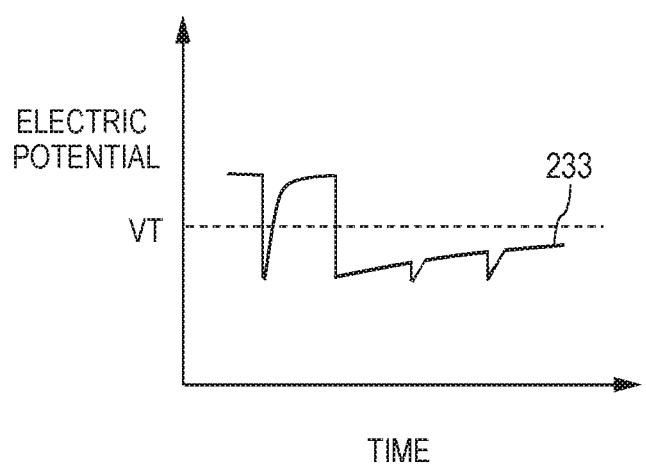

However, when even any one of the quench elements 231a, 231b, 231c, and 231d is unable to perform an ideal operation, the waveform of the electric potential at the node 233 is different from the waveform illustrated in FIG. 6B. FIG. 7A and FIG. 7B illustrate graphs illustrating the electric potential of each node when the quench element 231b has a higher effective resistance than the quench elements 231a, 231c, and 231d. In FIG. 7A and FIG. 7B, the incident timings of photons to the four photoelectric conversion units 201a, 201b, 201c, and 201d are the same as those in FIG. 6A and FIG. 6B.

In FIG. 7A, the changes of the electric potentials at the nodes 232a, 232c, and 232d are the same as those illustrated in FIG. 6A. With respect to the node 232b, however, the time period from a decrease to a recovery of the electric potential is longer. This is because the time constant of the circuit becomes larger due to a large effective resistance of the quench element 231b and thus the dead time $\tau_d$ indicated by Equations (1) or (2) described above becomes larger.

In this case, the electric potential at the node 233 corresponds to that illustrated in FIG. 7B. The number of times that the electric potential at the node 233 falls and crosses over the logic determination threshold VT is two. Thus, the count number counted by the counter circuit 209 is two. In such a way, in the comparative example, due to the influence of a longer time to recover the drop of the electric potential at the node 232b, an amount of drop of the electric potential at the time when photons enter the photoelectric conversion units 201c and 201d is not reflected to the count. In such a way, in the comparative example, the count number may not match the total number of incident photons, and the accuracy of a value output from the pixel signal processing unit 102 may decrease.

Figure 8A:
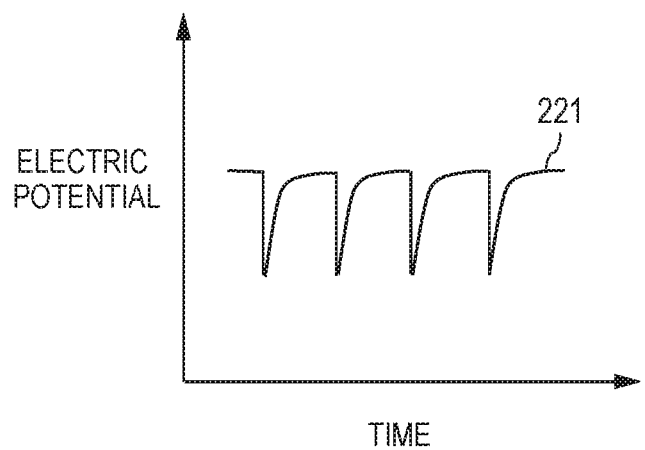
FIG. 8A and FIG. 8B are graphs illustrating an electric potential of each node in the first embodiment.
Figure 8B:
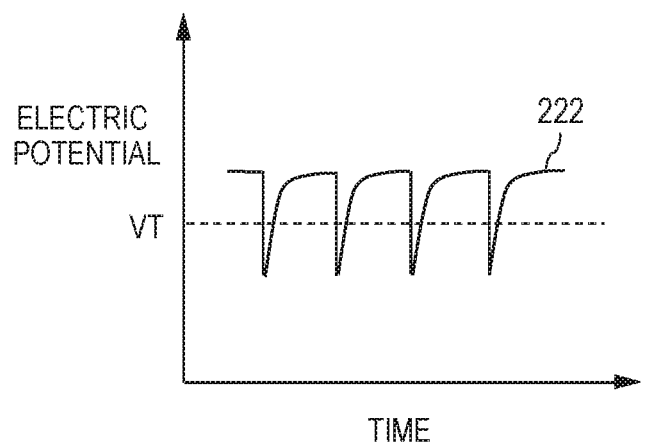

In the configuration of the present embodiment illustrated in FIG. 4A and FIG. 4B, the four photoelectric conversion units 201a, 201b, 201c, and 201d are connected to the single quench element 202 in series. In such a case, since the number of quench elements 202 is one, there is no accuracy deterioration due to performance variation among different quench elements. The electric potential of each node in such a case is illustrated in FIG. 8A and FIG. 8B. In FIG. 8A and FIG. 8B, the incident timing of photons to the four photoelectric conversion units 201a, 201b, 201c, and 201d is the same as those in FIG. 6A and FIG. 6B.

FIG. 8A is a graph illustrating a change of the electric potential at the node 221 of FIG. 4A. The four photoelectric conversion units 201a, 201b, 201c, and 201d are connected to the quench element 202 in a state where the output potentials are arithmetically averaged on the wirings. Thus, the number of times that the electric potential falls matches the number of photons entering the photoelectric conversion units 201a, 201b, 201c, and 201d.

FIG. 8B is a graph illustrating a change of the electric potential at the node 222 of FIG. 4A. In the present configuration, since the node 222 is in the same electric potential as that of the node 221, the waveform of FIG. 8B is the same as that of FIG. 8A. Thus, the number of times that the electric potential at the node 222 falls below the logical determination threshold VT is four, and the count number counted by the counter circuit 209 is four. The count number matches the total number of incident photons, and the correct value is output from the pixel signal processing unit 102.

As described above, in the present embodiment, the four photoelectric conversion units 201a, 201b, 201c, and 201d are connected to the single quench element 202 in series. Thus, there is no accuracy deterioration due to performance variation among different quench element. Therefore, according to the present embodiment, the photo-detection device 1010 with improved accuracy of an output signal is provided.

Further, since the present embodiment employs the configuration in which the single quench element 202 is provided to the four photoelectric conversion units 201a, 201b, 201c, and 201d, the number of quench elements can be reduced compared to the configuration in which a quench element is provided to each of the photoelectric conversion units. It is therefore possible to reduce the element area required for arrangement of quench elements and improve detection sensitivity of the photo-detection device 1010 by allocating the saved element area to the area of photoelectric conversion units.

Second Embodiment

In the first embodiment, the four photoelectric conversion units 201a, 201b, 201c, and 201d, the pixel signal processing unit 102, and the quench element 202 are formed on the same face on the same semiconductor substrate, as illustrated in FIG. 4A. In contrast, in the present embodiment, an example in which the four photoelectric conversion units 201a, 201b, 201c, and 201d are formed on a first substrate 500, the pixel signal processing unit 102 and the quench element 202 are formed on a second substrate 600 that is different from the first substrate 500 will be described.

Figure 9:
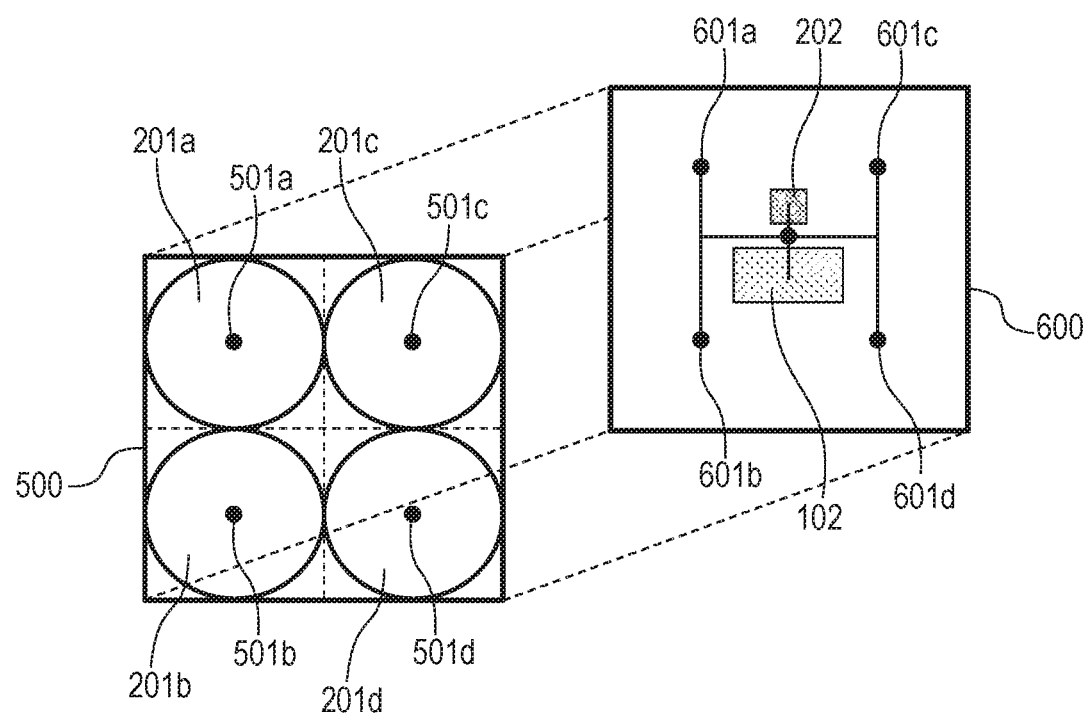
FIG. 9 is a schematic diagram illustrating a configuration example of a pixel according to a second embodiment.

FIG. 9 is a schematic diagram illustrating a configuration example of the pixel 100 according to the present embodiment. As illustrated in FIG. 9, the photo-detection device 1010 of the present embodiment has a first substrate 500 and the second substrate 600. The four photoelectric conversion units 201a, 201b, 201c, and 201d are formed on the first substrate 500. The pixel signal processing unit 102 and the quench element 202 are formed on the second substrate 600.

The first substrate 500 has electrodes 501a to 501d, and the second substrate 600 has electrodes 601a to 601d. The electrodes 501a to 501d are electrically connected to the electrodes 601a to 601d, respectively. Thereby, the same circuit configuration as that in the first embodiment is realized.

Also in the present embodiment, the photo-detection device 1010 with improved accuracy of an output signal is provided as with the first embodiment. Furthermore, with the pixel signal processing unit 102 and the quench element 202 being formed on the substrate different from the substrate for the photoelectric conversion units 201a, 201b, 201c, and 201d, a larger area of the photoelectric conversion units 201a, 201b, 201c, and 201d can be obtained. This can improve detection accuracy of the photo-detection device 1010 because of a wider light receiving area.

On the other hand, in the present embodiment, compared to the first embodiment, manufacturing cost may increase because of the increased number of substrates or the like. Therefore, when the priority is cost reduction, the configuration of the first embodiment may be more desirable.

Third Embodiment

In the first embodiment, the four photoelectric conversion units 201a, 201b, 201c, and 201d have the same area, as illustrated in FIG. 4A. In contrast, in the present embodiment, an example in which the area of the photoelectric conversion unit 201a is smaller than each area of the photoelectric conversion units 201b, 201c, and 201d will be described.

Figure 10:
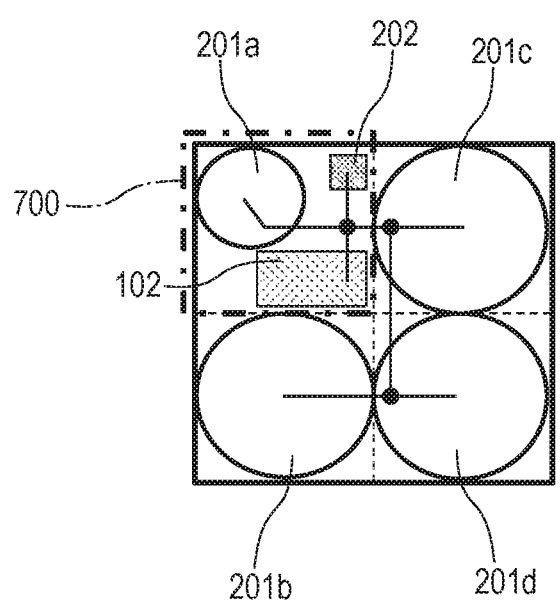
FIG. 10 is a schematic diagram illustrating a configuration example of a pixel according to a third embodiment.

FIG. 10 is a schematic diagram illustrating a configuration example of the pixel 100 according to the present embodiment. In the present embodiment, the area of the photoelectric conversion unit 201a is smaller than each area of the photoelectric conversion units 201b, 201c, and 201d. Each region in which any one of the photoelectric conversion units 201b, 201c, and 201d is arranged is denoted as a first region, a region in which the photoelectric conversion unit 201a is arranged is denoted as a second region 700, and then the first regions and the second region 700 are arranged in a matrix. Inside the second region 700, the photoelectric conversion unit 201a, the quench element 202, and the pixel signal processing unit 102 are arranged. With such a configuration, each area of the photoelectric conversion units 201b, 201c, and 201d can be increased compared to the case of the first embodiment, and detection sensitivity of the photo-detection device 1010 can be improved.

Note that the area of the photoelectric conversion unit 201a may be smaller than that in the case of the first embodiment. However, reduction in sensitivity due to the reduced area can be compensated by optimizing design of optics such as a micro lens or the like provided over the photoelectric conversion unit 201a to converge an incident light on a light receiving region of the photoelectric conversion unit 201a.

Fourth Embodiment

In the first embodiment, the single quench element 202 is connected to the four photoelectric conversion units 201a, 201b, 201c, and 201d, as illustrated in FIG. 4A. In contrast, in the present embodiment, an example in which two quench elements 202a and 202b are connected to the four photoelectric conversion units 201a, 201b, 201c, and 201d will be described.

Figure 11:
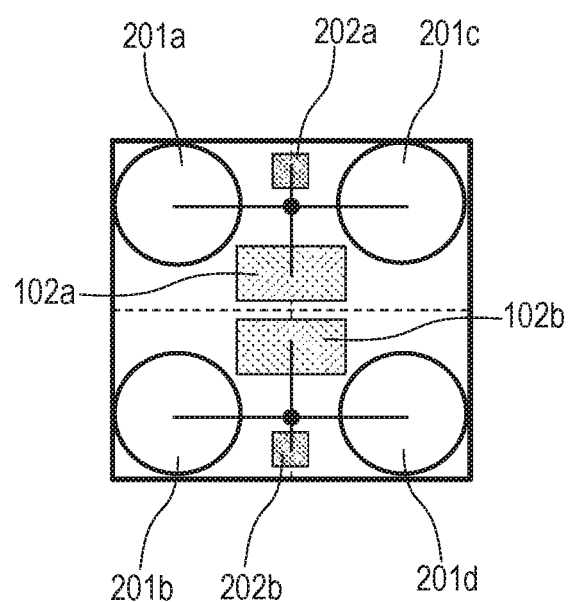
FIG. 11 is a schematic diagram illustrating a configuration example of a pixel according to a fourth embodiment.

FIG. 11 is a schematic diagram illustrating a configuration example of the pixel 100 according to the present embodiment. The pixel 100 of the present embodiment has the two quench elements 202a and 202b and two pixel signal processing units 102a and 102b. The two photoelectric conversion units 201a and 201c are connected to one quench element 202a and one pixel signal processing unit 102a. The two photoelectric conversion units 201b and 201d are connected to one quench element 202b and one pixel signal processing unit 102b. In such a way, in the present embodiment, one quench element, two photoelectric conversion units, and one pixel signal processing unit forming a set are arranged in one region, and the plurality of such regions are arranged on a semiconductor substrate.

While the first embodiment is configured to add and detect signals obtained by four photoelectric conversion units, the present embodiment is configured to add and detect signals obtained by two photoelectric conversion units. Thereby, two signals are obtained from one pixel 100 in the present embodiment. Thus, a space resolution of an image acquired by the photo-detection device 1010 is improved compared to the configuration of the first embodiment.

Note that respective areas of the photoelectric conversion units 201a, 201b, 201c, and 201d of the present embodiment may be smaller than those in the first embodiment. In a similar manner to the third embodiment, however, reduction in sensitivity due to the reduced area can be compensated by optimizing design of optics such as a micro lens or the like to converge an incident light on a light receiving region.

Fifth Embodiment

In the first embodiment, one quench element 202 is arranged between the two photoelectric conversion units 201a and 201c, as illustrated in FIG. 4A. In contrast, in the present embodiment, an example in which one quench element 202 is arranged in a second region 701 at the center of the first regions in which respective eight photoelectric conversion units 201a to 201h are arranged will be described.

Figure 12:
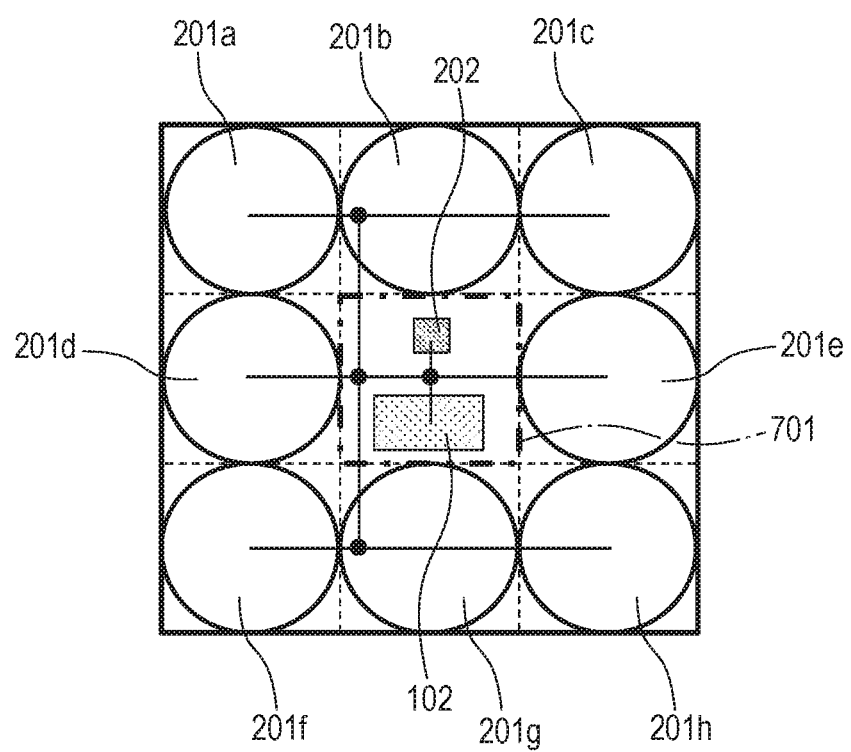
FIG. 12 is a schematic diagram illustrating a configuration example of a pixel according to a fifth embodiment.

FIG. 12 is a schematic diagram illustrating a configuration example of the pixel 100 according to the present embodiment. The pixel 100 of the present embodiment has the eight photoelectric conversion units 201a to 201h. The center of the first regions in which respective eight photoelectric conversion units 201a to 201h are arranged corresponds to the second region 701 in which no photoelectric conversion unit is provided. The first regions and the second region 701 are arranged in a matrix of three rows and three columns. The pixel signal processing unit 102 and the quench element 202 are arranged in the second region 701.

In the configuration of the first embodiment, when the area of the photoelectric conversion unit is small, it will be difficult to accommodate the photoelectric conversion unit, the quench element 202, and the pixel signal processing unit 102 in one region and arrange them in a matrix within the pixel 100. In the present embodiment, the configuration in which the quench element 202 and the pixel signal processing unit 102 only are arranged within the second region 701 and no photoelectric conversion unit is arranged therein allows for easier layout design.

Sixth Embodiment

Figure 13A:
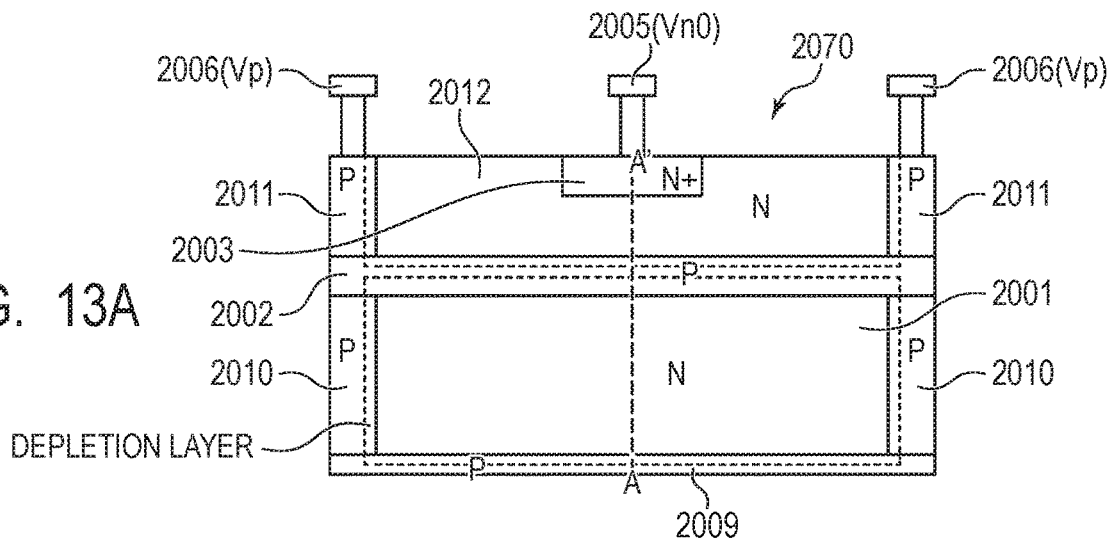
FIG. 13A, FIG. 13B, and FIG. 13C are schematic sectional views of a photoelectric conversion unit according to a sixth embodiment.
Figure 13B:
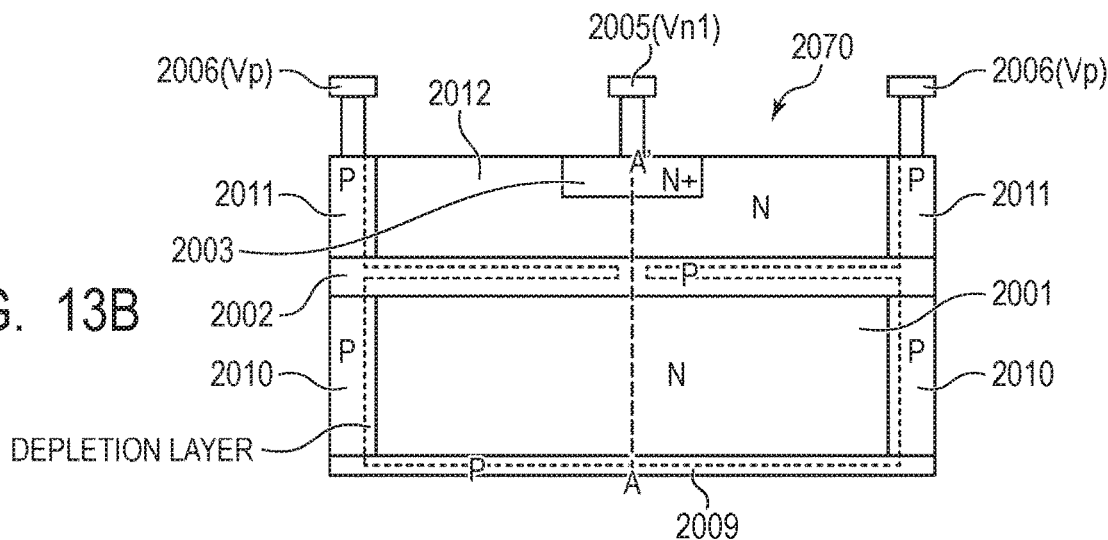
Figure 13C:
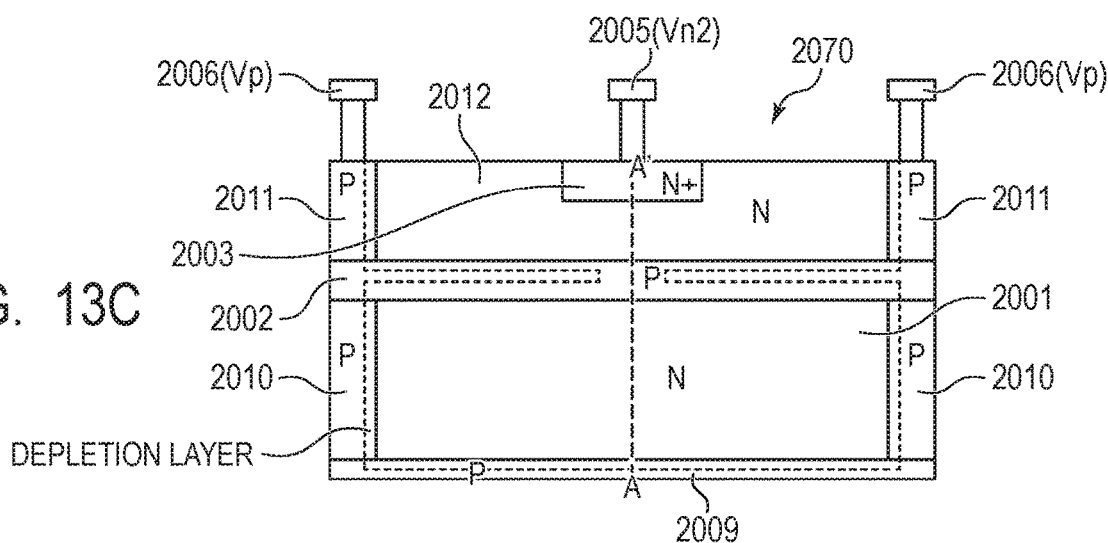

FIG. 13A, FIG. 13B, and FIG. 13C are diagrams schematically illustrating the sectional structure of a photoelectric conversion unit 2070. As illustrated in FIG. 13A, FIG. 13B, and FIG. 13C, the photoelectric conversion unit 2070 includes an N-type semiconductor region 2001, a P-type semiconductor region 2002, an N-type semiconductor region 2003, and an N-type semiconductor region 2012 formed on a semiconductor substrate. The N-type semiconductor region 2001 and the P-type semiconductor region 2002 form a photodiode (PD) that converts a light into signal charges and accumulates the converted signal charges. The P-type semiconductor region 2002, the N-type semiconductor region 2003, and the N-type semiconductor region 2012 form an avalanche diode (AD). As described later, the operation period of the photoelectric conversion unit 2070 is roughly classified into an accumulation period in which signal charges are accumulated in the PD and a readout period in which signal charges accumulated in the PD are transferred to the AD. Avalanche multiplication occurs in the AD due to transferred signal charges during at least a part of a readout period.

The photoelectric conversion unit 2070 further includes a P-type semiconductor region 2009 formed below the N-type semiconductor region 2001 and P-type semiconductor regions 2010 and 2011 formed on the sides of the N-type semiconductor regions 2001 and 2012. The P-type semiconductor regions 2010 and 2011 isolate adjacent photoelectric conversion units 2070 from each other.

The arrangement in the sectional structure of the above semiconductor regions is as illustrated in FIG. 13A or the like. In particular, the N-type semiconductor region 2001 is surrounded by the P-type semiconductor regions 2002, 2009, and 2010. Further, the P-type semiconductor region 2002 is at least partially arranged between the N-type semiconductor region 2001 and the N-type semiconductor region 2003. The N-type semiconductor region 2012 has a low impurity concentration than the N-type semiconductor region 2003 and is arranged between the P-type semiconductor region 2002 and the N-type semiconductor region 2003. At least a part of the N-type semiconductor region 2012 forms an avalanche multiplication unit. Note that an incident light is received from the upper side in FIG. 13A, FIG. 13B, and FIG. 13C.

An electric potential control unit 2005 is connected to the N-type semiconductor region 2003. The electric potential control unit 2005 applies an electric potential Vn to the N-type semiconductor region 2003. An electric potential control unit 2006 is connected to the P-type semiconductor region 2011. The electric potential control unit 2006 applies an electric potential Vp to the P-type semiconductor region 2011. The electric potential Vp may be supplied also to the p-type semiconductor regions 2002, 2009, and 2010 via the P-type semiconductor region 2011. In a state illustrated in FIG. 13A, the N-type semiconductor region 2001 is electrically floating.

The potential distribution inside the semiconductor substrate is determined by the arrangement of respective semiconductor regions described above, the impurity concentration distribution of the respective semiconductor regions, and the electric potentials applied to the electric potential control unit 2005 and the electric potential control unit 2006. It is therefore possible to switch an accumulation period state and a readout period state described above by controlling the electric potentials applied to the electric potential control unit 2005 and the electric potential control unit 2006. Further, to realize a predetermined potential state such as to generate avalanche multiplication at the time of signal charge transfer, the arrangement of respective semiconductor regions described above and the impurity concentration distribution of respective semiconductor regions may be adjusted at the time of designing the photo-detection device.

FIG. 13A, FIG. 13B, and FIG. 13C illustrate examples in which the value of the electric potential Vn applied to the N-type semiconductor region 2003 is changed to Vn0, Vn1, and Vn2. Further, FIG. 14A, FIG. 14B, and FIG. 14C are diagrams illustrating potentials along a line A-A' corresponding to FIG. 13A, FIG. 13B, and FIG. 13C, respectively. In these three examples, the height of the potential barrier occurring between the N-type semiconductor region 2001 and the N-type semiconductor region 2003 is different from each other. Thereby, the period in which signal charges are accumulated in the N-type semiconductor region 2001 and the period in which signal charges are read out from the N-type semiconductor region 2001 to the N-type semiconductor region 2003 are controlled. While a fixed electric potential Vp is applied to the P-type semiconductor region 2002 for simplified illustration in FIG. 13A, FIG. 13B, and FIG. 13C, the electric potential applied to the P-type semiconductor region 2002 may be different from each other. Note that each dashed line in FIG. 13A, FIG. 13B, and FIG. 13C represents the end of a depletion layer.

FIG. 13A is a diagram illustrating the photoelectric conversion unit 2070 in a state where signal charges are accumulated in the N-type semiconductor region 2001, and FIG. 14A is a diagram illustrating the potential along the line A-A' of FIG. 13A. The electric potential Vn0 applied to the electric potential control unit 2005 is higher than the electric potential Vp applied to the electric potential control unit 2006. That is, a reverse bias is applied to the PN junction, and a depletion layer spreads near the PN junction interface. As illustrated in FIG. 13A, a neutral region is present in a part of the P-type semiconductor region 2002. A large number of holes, which are a large number of carriers in the P-type semiconductor region 2002, are present in a neutral region of the P-type semiconductor region 2002. Thus, the electric potential of the neutral region of the P-type semiconductor region 2002 is substantially the same as the electric potential Vp of the electric potential control unit 2006. Note that a neutral region is present in each of the P-type semiconductor regions 2011, 2010, and 2009.

In a dark state, that is, when there is no signal charge, the depletion layer spreads over the entire N-type semiconductor region 2001 in the state of FIG. 13A. At this time, at least a reverse bias voltage that is a so-called "depleting voltage" occurs between the neutral region of the P-type semiconductor region 2002 (and the neutral region of other P-type semiconductor region in the periphery) and the N-type semiconductor region 2001. In other words, with respect to signal charges (electrons) present in the N-type semiconductor region 2001, a potential barrier corresponding to a voltage that is the sum of a built-in potential at the PN junction and a depleting voltage occurs around the N-type semiconductor region 2001. Therefore, in the potential distribution along the line A-A', the potential barrier to electrons in the N-type semiconductor region 2001 occurs between the N-type semiconductor region 2001 and the N-type semiconductor region 2003, as illustrated in FIG. 14A. Note that the depleting voltage of the PD described above is typically the same level as the depleting voltage of the PD in an image sensor such as a CMOS sensor, a CCD sensor, or the like, that is, around 1V to 2V.

In FIG. 13A, the electric potential Vn0 applied to the N-type semiconductor region 2003 is higher than the electric potential Vp applied to the electric potential control unit 2006. Therefore, a reverse bias voltage corresponding to the difference between the electric potential Vn0 and the electric potential Vp is applied to the PN junction between the P-type semiconductor regions 2002 and 2011 and the N-type semiconductor regions 2003 and 2012. Further, a depletion layer in accordance with the reverse bias spreads over the P-type semiconductor region 2002 and the P-type semiconductor region 2011. The electric potential Vn0 is set so that basically no avalanche multiplication occurs at the PN junction of the AD formed of the P-type semiconductor region 2002 and the N-type semiconductor regions 2003 and 2012 in this state of FIG. 13A. Further, signal charges generated by light incidence are accumulated in the N-type semiconductor regions 2001.

FIG. 13B is a diagram illustrating a state in which the electric potential Vn applied to the N-type semiconductor region 2003 changes from Vn0 to Vn1 that is higher than Vn0. The value Vn1 is an electric potential higher than the value Vn0, and on the other hand, the value Vp is fixed. Thus, a larger reverse bias than that in the case of FIG. 13A is applied to the PN junction between the P-type semiconductor region 2002 and 2011 and the N-type semiconductor region 2003 and 2012. Further, in response, the depletion layer of the P-type semiconductor region 2002 spreads wider than the case of FIG. 13A. As a result, when the electric potential Vn is Vn1, the depletion layer of the P-type semiconductor region 2002 around the N-type semiconductor region 2001 is connected to the depletion layer of the P-type semiconductor region 2002 around the N-type semiconductor region 2003. In other words, a state where a depletion layer extends continuously from the N-type semiconductor region 2001 to the N-type semiconductor region 2003 is resulted.

The potential of a depleted portion of the P-type semiconductor region 2002 is lower than the potential of the neutral region of the P-type semiconductor region 2002 (substantially the same as Vp). This is because there is an influence of the electric potential Vn applied to the N-type semiconductor region 2003. Therefore, in the potential distribution along the line A-A' of FIG. 13B, the height of the potential barrier between the N-type semiconductor region 2001 and the N-type semiconductor region 2003 becomes lower than the case of FIG. 13A, as illustrated in FIG. 14B.

At this time, most part of the circumference of the N-type semiconductor region 2001 is surrounded by the neutral regions of the P-type semiconductor regions 2002, 2009, and 2010. Further, the electric potential Vp of the electric potential control unit 2006 is fixed. Thus, the potential at the center of the N-type semiconductor region 2001 does not substantially change. Therefore, as described above, it is possible to reduce locally the height of the potential barrier to the N-type semiconductor region 2001.

In FIG. 13B, when signal charges are being accumulated in the N-type semiconductor region 2001, the signal charges exceed the potential barrier and start being transferred to the N-type semiconductor region 2003. At this time, it is preferable that there be a state where a reverse bias voltage of a degree that can cause avalanche multiplication has occurred between the N-type semiconductor region 2003 and the P-type semiconductor region 2002.

After a continuous depletion layer is formed, the electric potential Vn applied to the N-type semiconductor region 2003 changes from Vn1 to the electric potential Vn2 that is higher than Vn1. In response, the potential barrier gradually decreases. Further, in accordance with the change of the electric potential Vn, the width of a depletion layer generated in the P-type semiconductor region 2002 also changes.

FIG. 13C is a diagram illustrating a state where substantially no potential barrier remains between the N-type semiconductor region 2001 and the N-type semiconductor region 2003. Further, FIG. 14C is a diagram illustrating the potential along the line A-A' of FIG. 13C. At this time, the electric potential Vn2 is applied to the N-type semiconductor region 2003. In the state of FIG. 14C, the entire signal charges accumulated in the N-type semiconductor region 2001 are transferred to the N-type semiconductor region 2003. That is, full depleting transfer is possible.

A voltage required for such full depleting transfer is lower for a lower impurity concentration of the P-type semiconductor region 2002 and, in contrast, is higher for a higher impurity concentration of the P-type semiconductor region 2002. The impurity concentration of the P-type semiconductor region 2002 or the N-type semiconductor region 2012 is set so that a reverse bias which causes avalanche multiplication to occur is generated between the P-type semiconductor region 2002 and the N-type semiconductor region 2003 during at least a part of the period when signal charges are being transferred as described above.

Note that, in a dark state, when the electric potential Vn changes from the state of FIG. 13B to the state of FIG. 13C, the potential of the N-type semiconductor region 2001 may slightly change. However, since the P-type semiconductor region 2002 is closer to the N-type semiconductor region 2003 supplied with the electric potential Vn than the N-type semiconductor region 2001 is, the P-type semiconductor region 2002 is more influenced by a change of the electric potential Vn. Therefore, the potential of a depleted potential of the P-type semiconductor region 2002 is more likely to change than the N-type semiconductor region 2001. As a result, it is possible to remove the potential barrier between the N-type semiconductor region 2001 and the N-type semiconductor region 2003.

In the present embodiment, the neutral region remains in the P-type semiconductor region 2009 and the P-type semiconductor region 2010 in FIG. 13C. According to such a configuration, since the electric potential Vp can be supplied to most part of the circumference of the N-type semiconductor region 2001, a change in the potential of the N-type semiconductor region 2001 can be suppressed to a small level in the state of FIG. 14B and FIG. 14C. Therefore, even when the change amount of the electric potential Vn is not so large, full transfer of charges is possible. However, the whole of the P-type semiconductor region 2009 or the P-type semiconductor region 2010 may be depleted while the electric potential Vn changes from Vn0 to Vn2.

As described above, the photoelectric conversion unit 2070 of the present embodiment can control the height of the potential barrier between the N-type semiconductor region 2001 and the N-type semiconductor region 2003 by the control of the electric potential Vn. Therefore, the photodetection device having the photoelectric conversion unit 2070 of the present embodiment can selectively perform an operation of accumulating signal charges to the N-type semiconductor region 2001 and an operation of reading out signal charges from the N-type semiconductor region 2001 to the N-type semiconductor region 2003.

It has been described that, when signal charges are transferred in FIG. 13B, it is preferable to cause avalanche multiplication to occur. However, the timing when a reverse bias of a level that causes avalanche multiplication to occur is applied and the timing when depletion layers are connected to each other (that is, the timing when the potential barrier starts decreasing) may be different from each other while the electric potential Vn changes from Vn0 to Vn2. The timing when a reverse bias of a level that causes avalanche multiplication to occur is applied may be faster than or may be later than the timing when depletion layers are connected to each other in the P-type semiconductor region 2002. The saturated charge amount in the N-type semiconductor region 2001 is determined by the potential barrier when a bias voltage which can start signal detection by using avalanche multiplication is applied.

Figure 15A:
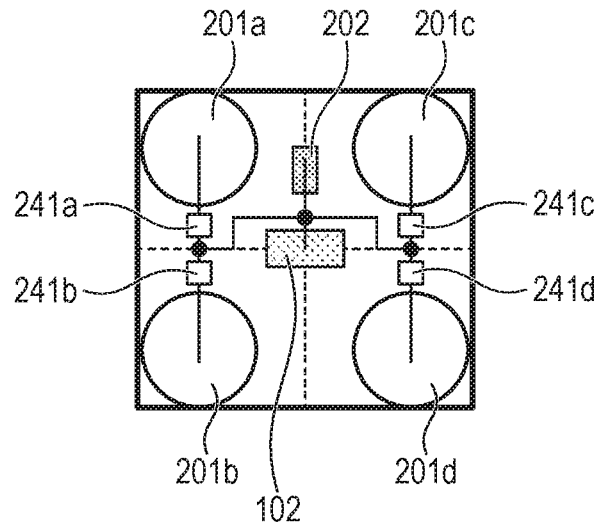
FIG. 15A and FIG. 15B are diagrams illustrating a configuration example of a photoelectric conversion element according to the sixth embodiment.
Figure 15B:
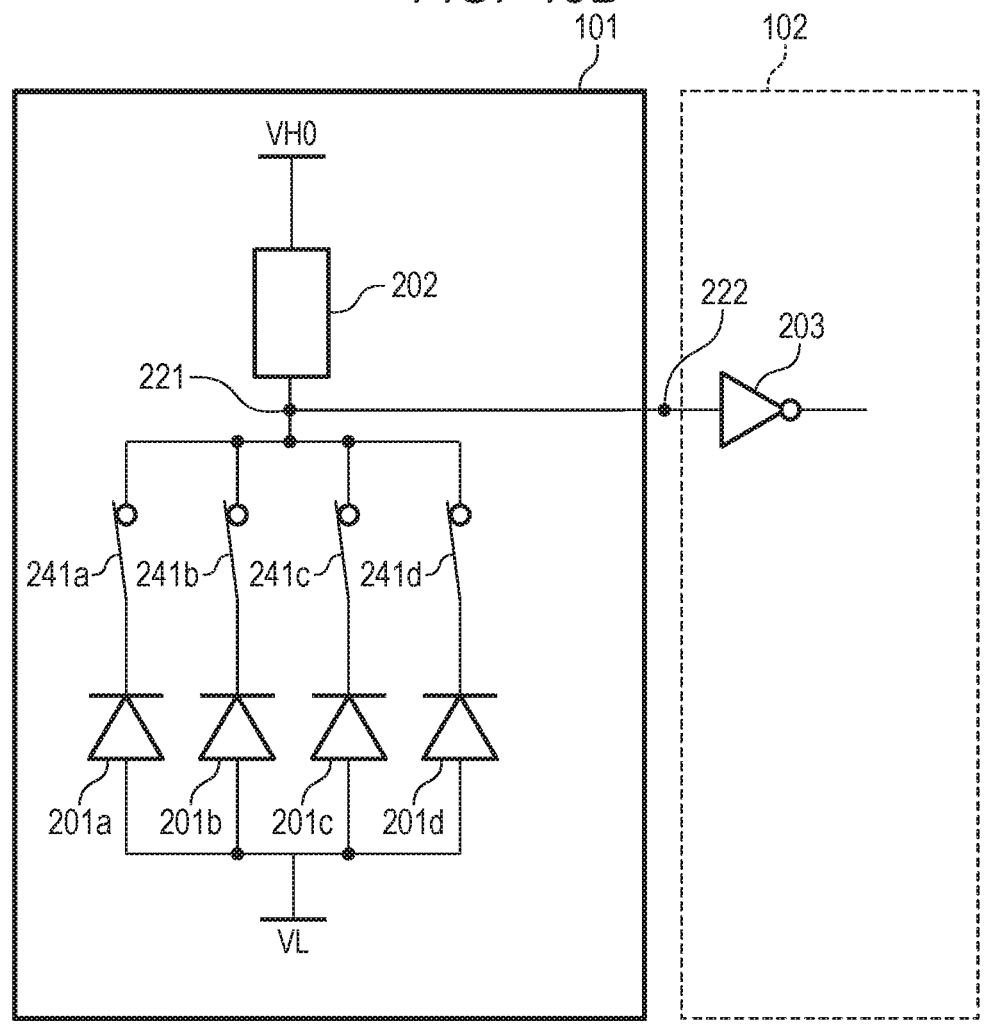

A configuration example of the photoelectric conversion element 101 having the photoelectric conversion unit 2070 configured as described above will be described. FIG. 15A and FIG. 15B are diagrams illustrating a configuration example of the photoelectric conversion element 101 according to the present embodiment. FIG. 15A and FIG. 15B is different from FIG. 4A and FIG. 4B in that switch elements 241a, 241b, 241c, and 241d are added to the photoelectric conversion units 201a, 201b, 201c, and 201d, respectively. In this example, it is assumed that each of the photoelectric conversion units 201a, 201b, 201c, and 201d has the same configuration as the photoelectric conversion unit 2070 described above. The photoelectric conversion unit 201a is connected to the node 221, which is the connection node to the quench element 202, via the switch element 241a. The photoelectric conversion unit 201b is connected to the node 221 via the switch element 241b. The photoelectric conversion unit 201c is connected to the node 221 via the switch element 241c. The photoelectric conversion unit 201d is connected to the node 221 via the switch element 241d.

As illustrated in FIG. 15B, in the initial state, all the switch elements 241a, 241b, 241c, and 241d are in an on-state, and an electric potential VH0 is supplied to the photoelectric conversion units 201a, 201b, 201c, and 201d. Then, for example, only the switch element 241a is maintained to the on-state, the remaining switches 241b, 241c, and 241d are turned off, and this results in a state where the electric potential VH0 is supplied to only the photoelectric conversion unit 201a.

A drive method of the photoelectric conversion element 101 will be described by using a timing chart illustrated in FIG. 16. The reference "cathode electric potential" in FIG. 16 denotes an electric potential applied to the electric potential control unit 2005, and references "241a", "241b", "241c", and "241d" in FIG. 16 denote an on-state or an off-state of the corresponding switch elements.

After the initial state described above, the switch elements 241a, 241b, 241c, and 241d are turned off, and the photoelectric conversion units 201a, 201b, 201c, and 201d are in an accumulation state where charges are accumulated. At the time t1, only the switch element 241a is turned on. At this time, the remaining switch elements 241b, 241c, and 241d are maintained to the off-state. On and before the time t2, the cathode electric potential of the photoelectric conversion unit 201a is VH0. At this time, a bias voltage required for causing avalanche multiplication to occur is not applied to the photoelectric conversion unit 201a, and the photoelectric conversion unit 201a is in a state before the potential barrier starts decreasing. Therefore, charges accumulated in the photoelectric conversion unit 201a are not read out from the electric potential control unit 2005. In other words, a period on and before the time t2 is an accumulation period 251a. The potential along the line A-A' of FIG. 13A at this time corresponds to FIG. 14A. As illustrated in FIG. 14A, charges accumulated in the N-type semiconductor region 2001 have not yet reached the N-type semiconductor region 2003 due to the potential barrier of the P-type semiconductor region 2002.

At the time t2, the cathode electric potential of the photoelectric conversion unit 201a starts transition from VH0. From the time when the cathode electric potential becomes VH1, a bias required to cause avalanche multiplication to occur starts being applied to the photoelectric conversion unit 201a. Thereby, the potential barrier decreases, and accumulated charges start being read out gradually. The potential along the line A-A' of FIG. 13B at this time corresponds to FIG. 14B. As illustrated in FIG. 14B, the potential barrier of the P-type semiconductor region 2002 decreases, and thereby a part of charges accumulated in the N-type semiconductor region 2001 reaches the N-type semiconductor region 2003.

In a period from the time t2 to the time t3, the cathode electric potential of the photoelectric conversion unit 201a gradually transitions from VH0 to VH2. Around the time t3, a bias sufficient to cause avalanche multiplication to occur is applied to the photoelectric conversion unit 201a, all the accumulated signal charges are transferred, and full depleting transfer is realized. The potential along the line A-A' of FIG. 13C at this time corresponds to FIG. 14C. As illustrated in FIG. 14C, the potential barrier of the P-type semiconductor region 2002 decreases, and thereby all the charges accumulated in the N-type semiconductor region 2001 reach the N-type semiconductor region 2003. In such a way, charges accumulated in the photoelectric conversion unit 201a are read out. In other words, the period from the time t2 to the time t3 is a readout period 252a.

Then, the cathode electric potential of the photoelectric conversion unit 201a transitions from VH2 to VH0 at the time t3. This results in a state where a bias required to cause avalanche multiplication to occur is not applied to the photoelectric conversion unit 201a, and the potential barrier returns to the same state occurring on and before the time t2. In other words, the period on and after the time 3 is the accumulation period 251a. Note that the count number of charges transferred from the photoelectric conversion unit 201a is reset after the readout period 252a.

The same process as the readout from the photoelectric conversion unit 201a described above is performed sequentially on the photoelectric conversion units 201b, 201c, and 201d. Thereby, charges accumulated in the photoelectric conversion units 201a, 201b, 201c, and 201d are sequentially read out.

In the first embodiment described above, the circuit is configured such that it is not possible to distinguish which of the four photoelectric conversion units 201a, 201b, 201c, and 201d generates charges that cause an output signal. In contrast, in the present embodiment, it is possible to control to perform separate readout on the photoelectric conversion units 201a, 201b, 201c, and 201d, respectively. Therefore, according to the present embodiment, the photo-detection device 1010 that can distinguish which of the four photoelectric conversion units 201a, 201b, 201c, and 201d generates charges that cause an output signal is provided. Note that, in the present embodiment, signal charges may be holes, and in such a case, N-type and P-type of each semiconductor region will be opposite.

Seventh Embodiment

In the present embodiment, an example of a photo-detection system using the photo-detection device 1010 of the first to sixth embodiments will be described with reference to FIG. 17. The photo-detection system of the present embodiment is an invisible-light detection system that detects light in the wavelength band of invisible light and used for a medical diagnosis system such as a Positron Emission Tomography (PET). Note that the pixel 100 in the present embodiment has a TDC 204 and a memory 205 instead of the counter circuit 209 of FIG. 2.

FIG. 17 is a block diagram of the invisible-light detection system. The invisible-light detection system has a plurality of photo-detection devices 1010A and 1010B, a wavelength conversion unit 1201, and a data processing unit 1207. Each of the plurality of photo-detection devices 1010A and 1010B is the same as the photo-detection device 1010 of the first to sixth embodiments except that the TDC 204 and the memory 205 are provided instead of the counter circuit 209.

An emission object 1200 emits a light in the wavelength band of invisible light (first wavelength band). The wavelength conversion unit 1201 receives the invisible light emitted from the emission object 1200 and emits a light in the wavelength band of visible light (second wavelength band). The visible light emitted from the wavelength conversion unit 1201 enters the photoelectric conversion unit 201. The photoelectric conversion unit 201 photoelectrically converts the incident light into an electric signal. The electric signal is held in the memory 205 as a digital signal via the quench element 202, the waveform shaping unit 203, and the TDC 204. The plurality of photo-detection devices 1010A and 1010B may be formed as a single device or may be formed as a plurality of devices.

A plurality of digital signals held in the memories 205 in the plurality of photo-detection devices 1010A and 1010B are read out by the data processing unit 1207 to perform signal processing. The data processing unit 1207 functions as a signal processing unit that performs a synthesis process of a plurality of images obtained from the plurality of digital signals.

Next, the configuration of the medical diagnosis system such as a PET will be described as a specific example of the invisible-light detection system. A subject that is the emission object 1200 emits radiation pairs such as a gamma ray from the living body. The wavelength conversion unit 1201 includes a scintillator, and the scintillator emits visible light in response to the incidence of the radiation pair emitted from the subject.

The visible light emitted from the scintillator enters the photo-detection devices 1010A and 1010B, and the digital signals based on the incident light are stored in the memories 205. Thereby, the photo-detection devices 1010A and 1010B can detect the arrival time of each of the radiation pair emitted from the subject.

The plurality of digital signals stored in the memories 205 in the plurality of photo-detection devices 1010A and 1010B are read out by the data processing unit 1207 to perform signal processing. The data processing unit 1207 performs a synthesis process such as image reconstruction by using a plurality of images obtained from the plurality of digital signals and generates an image inside the living body of the subject.

According to the present embodiment, with the use of the photo-detection devices 1010A and 1010B in which the detection performance is improved, a photo-detection system with higher accuracy such as an invisible-light detection system, a medical diagnosis system, or the like can be provided.

Eighth Embodiment

In the present embodiment, another example of a photo-detection system using the photo-detection device 1010 of any of the first to sixth embodiments will be described with reference to FIG. 18, FIG. 19A and FIG. 19B.

First, a distance detection system that is an example of the photo-detection system will be described with reference to FIG. 18. Note that the pixel 100 of the present embodiment has the TDC 204 and the memory 205 instead of the counter circuit 209 in FIG. 2.

Figure 18:
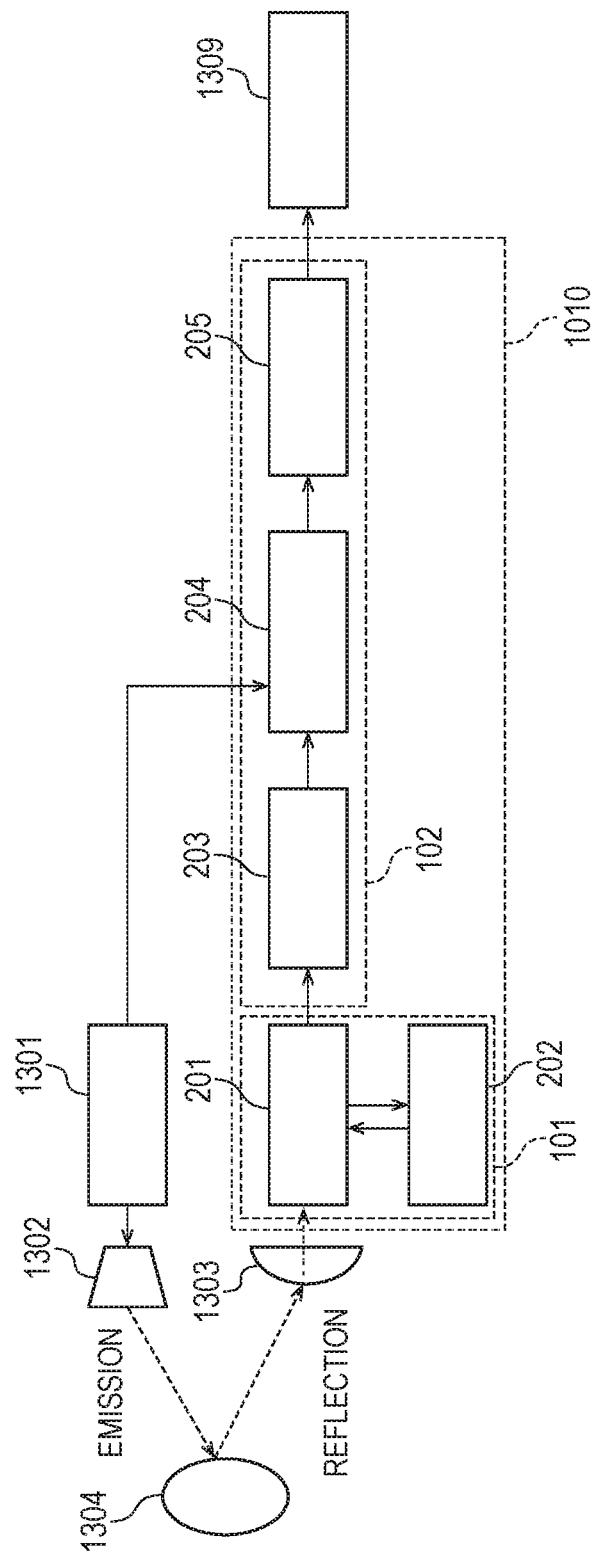
FIG. 18 is a block diagram of the photo-detection system according to an eighth embodiment.

FIG. 18 is a block diagram of the distance detection system. The distance detection system has a light source control unit 1301, a light emitting unit 1302, an optical member 1303, the photo-detection device 1010, and a distance calculation unit 1309.

The light source control unit 1301 controls driving of the light emitting unit 1302. The light emitting unit 1302 is a light emitting device that emits a light of short pulses (sequence) in the image capturing direction in response to the signal from the light source control unit 1301.

The light emitted from the light emitting unit 1302 is reflected by a subject 1304. The reflected light is received at the photoelectric conversion unit 201 of the photo-detection device 1010 through the optical members 1303 such as a lens. The photoelectric conversion unit 201 outputs a signal based on the incident light, and the signal is input to the TDC 204 via the waveform shaping unit 203.

The TDC 204 acquires a signal indicating a timing of light emission from the light emitting unit 1302 from the light source control unit 1301. The TDC 204 compares the signal acquired from the light source control unit 1301 with the signal input from the waveform shaping unit 203. Thereby, the TDC 204 outputs, as a digital signal, a time period from the time when a pulsed light is emitted by the light emitting unit 1302 to the time when the reflected light reflected by the subject 1304 is received. The digital signal output from the TDC 204 is stored in the memory 205. The process is repeated for multiple times, and the memory 205 can store digital signals of a plurality of times of processing.

The distance calculation unit 1309 calculates a distance from the photo-detection device 1010 to the subject 1304 based on the plurality of digital signals stored in the memory 205. The distance detection system can be applied to an on-vehicle distance detection device, for example. Note that, since a process performed in the distance calculation unit 1309 is digital signal processing, the process may be more generally referred to as a signal processing unit.

Next, a photo-detection system using the photo-detection device 1010 as an on-vehicle camera will be described with reference to FIG. 19A and FIG. 19B. FIG. 19A and FIG. 19B are diagrams illustrating a configuration of the photo-detection system 1000 and a mobile apparatus according to the present embodiment.

Figure 19A:
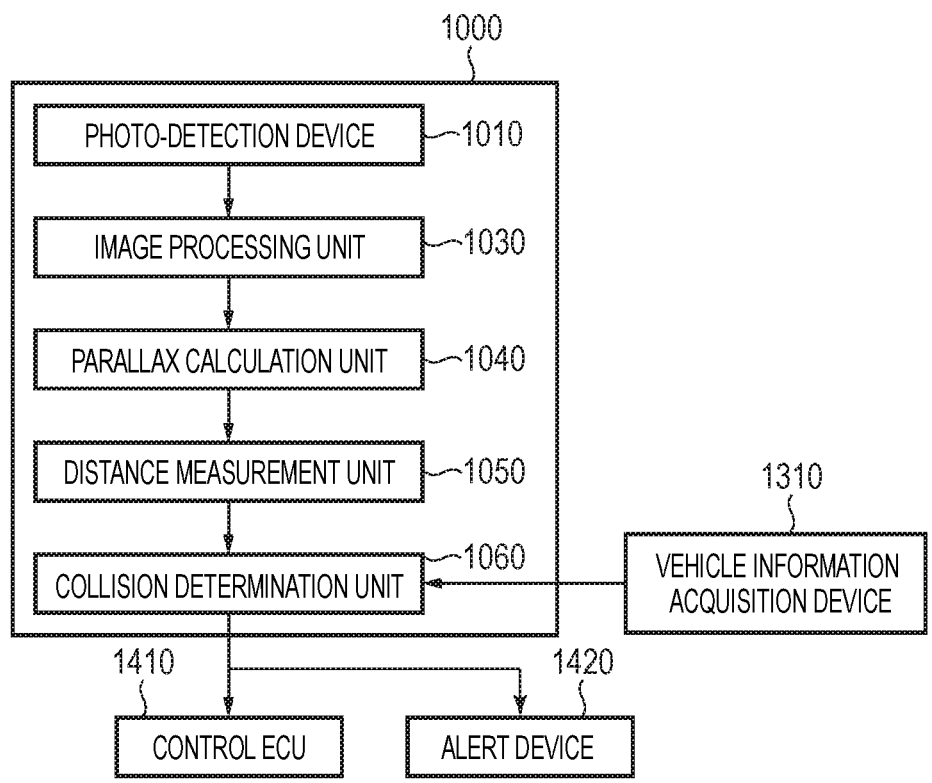
FIG. 19A and FIG. 19B are diagrams illustrating a configuration example of the photo-detection system and a mobile apparatus according to the eighth embodiment.
Figure 19B:
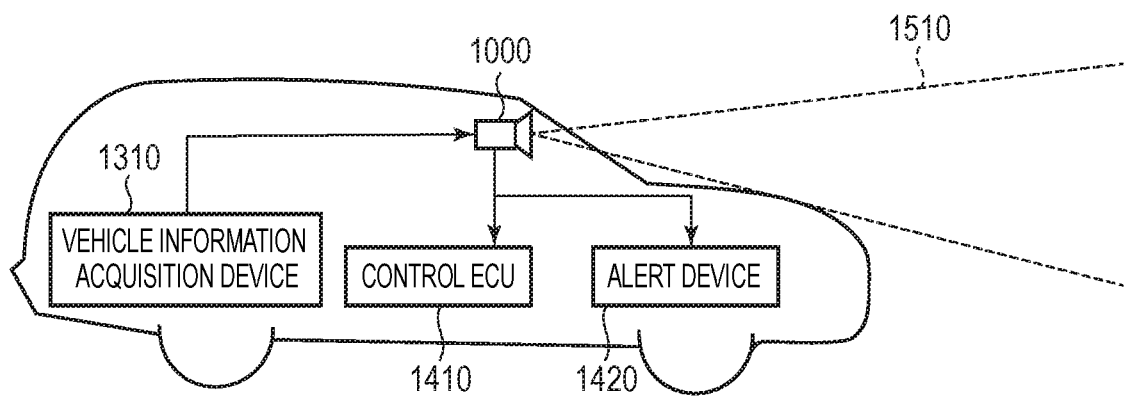

FIG. 19A is a block diagram illustrating an example of the photo-detection system 1000 related to an on-vehicle camera. The photo-detection system 1000 has the photo-detection device 1010 according to the first embodiment. The photo-detection system 1000 has an image processing unit 1030 that performs image processing on a plurality of digital signals acquired by the photo-detection device 1010. The photo-detection system 1000 further has a parallax calculation unit 1040 that calculates a parallax (a phase difference of parallax images) from the plurality of image data acquired by the image processing unit 1030.

Further, the photo-detection system 1000 has a distance measurement unit 1050 that calculates a distance to the object based on the calculated parallax and a collision determination unit 1060 that determines whether or not there is a collision possibility based on the calculated distance. Here, the parallax calculation unit 1040 and the distance measurement unit 1050 are an example of a distance information acquisition unit that acquires distance information on the distance to the object. That is, the distance information is information on a parallax, a defocus amount, a distance to an object, or the like.

The collision determination unit 1060 may use any of the distance information to determine the collision possibility. The distance information acquisition unit may be implemented by dedicatedly designed hardware, may be implemented by a software module, or may be implemented by combination thereof. Further, the distance information acquisition unit may be implemented by a Field Programmable Gate Array (FPGA), an Application Specific Integrated Circuit (ASIC), or the like. Further, combination of the components described above may be used for implementation.

The photo-detection system 1000 is connected to the vehicle information acquisition device 1310 and can acquire vehicle information such as a vehicle speed, a yaw rate, a steering angle, or the like. Further, the photo-detection system 1000 is connected to a control ECU 1410, which is a control device that outputs a control signal for causing a vehicle to generate braking force based on a determination result by the collision determination unit 1060.

Further, the photo-detection system 1000 is connected with an alert device 1420 that issues an alert to the driver based on a determination result by the collision determination unit 1060. For example, when the collision probability is high as the determination result of the collision determination unit 1060, the control ECU 1410 performs vehicle control to avoid a collision or reduce damage by applying a brake, pushing back an accelerator, suppressing engine power, or the like. The alert device 1420 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the photo-detection system 1000. FIG. 19B illustrates the photo-detection system 1000 in a case of capturing a front area of a vehicle (a capturing area 1510). The vehicle information acquisition device 1310 transmits instructions to the photo-detection system 1000 or the photo-detection device 1010 so as to perform a predetermined operation. Such a configuration enables further improvement of the ranging accuracy.

Although a control of avoiding a collision to another vehicle has been described in the example described above, the photo-detection system 1000 is applicable to automatic driving control for following another vehicle, automatic driving control for not going out of a traffic lane, or the like. Furthermore, the photo-detection system 1000 can be applied to not only a vehicle but also a mobile apparatus (moving apparatus) such as a ship, an airplane, or an industrial robot, for example. In addition, the photo-detection system can be widely applied to a device which utilizes object recognition, such as an intelligent transportation system (ITS), without being limited to mobile apparatuses.

According to the present embodiment, by using the photo-detection device 1010 with the improved detection performance, the photo-detection system and the mobile apparatus with higher performance can be provided.

Modified Embodiments

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is one of the embodiments of the present invention.

Further, the systems illustrated in the seventh and eighth embodiments illustrate example configurations of a system to which the photo-detection device of the present invention may be applied, and a system to which the photo-detection device of the present invention can be applied is not limited to those configurations illustrated in FIG. 17 to FIG. 19B.

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-082796, filed Apr. 24, 2018, and Japanese Patent Application No. 2019-022355, filed Feb. 12, 2019, which are hereby incorporated by reference herein in their entirety.

What is claimed is:

1. A photo-detection device comprising:
a plurality of avalanche diodes;
a quench element configured to suppress avalanche multiplication in the plurality of avalanche diodes; and
a pixel signal processing unit configured to process a signal obtained by summing signals output from respective ones of the plurality of avalanche diodes,
wherein the quench element, the number of which is one, is connected to the plurality of avalanche diodes in series,
wherein the plurality of avalanche diodes and the quench element are formed on the same substrate, and
wherein the quench element is arranged between two avalanche diodes of the plurality of avalanche diodes in a plan view from a direction perpendicular to the substrate.

2. The photo-detection device according to claim 1, wherein a plurality of regions each including the one quench element and two avalanche diodes connected to the one quench element in series are arranged on the substrate.

3. The photo-detection device according to claim 1, wherein the plurality of avalanche diodes are connected in parallel to each other.

4. The photo-detection device according to claim 1, wherein the quench element includes an active quench circuit configured to suppress the avalanche multiplication by changing an electric potential supplied to the avalanche diodes.

5. The photo-detection device according to claim 1 further comprising a plurality of switch elements each corresponding to one of the plurality of avalanche diodes, wherein each of the plurality of switch elements is connected between a corresponding avalanche diode and the quench element.

6. The photo-detection device according to claim 5, wherein the plurality of avalanche diodes output signals to the pixel signal processing unit at timings different from each other by the plurality of switch elements being turned on at timings different from each other.

7. A photo-detection system comprising:
the photo-detection device according to claim 1; and a signal processing unit configured to process a signal output from the photo-detection device.

8. A photo-detection system comprising:
a wavelength conversion unit configured to convert a light in a first wavelength band into a light in a second wavelength band that is different from the first wavelength band;
a plurality of photo-detection devices according to claim 1 configured to receive the light in the second wavelength band converted by the wavelength conversion unit; and
a signal processing unit configured to perform a synthesis process of a plurality of images based on a plurality of signals acquired by the plurality of photo-detection devices.

9. A photo-detection system comprising:
a light emitting unit configured to emit a light;
the photo-detection device according to claim 1 configured to detect the light; and
a distance calculation unit configured to perform distance calculation by using a signal based on the light detected by the photo-detection device.

10. A mobile apparatus comprising:
the photo-detection device according to claim 1;
a distance information acquisition unit configured to acquire distance information on a distance to an object, from a parallax image based on signals from the photo-detection device; and
a control unit configured to control the mobile apparatus based on the distance information.

11. A photo-detection device comprising:
a plurality of avalanche diodes;
a quench element configured to suppress avalanche multiplication in the plurality of avalanche diodes; and
a pixel signal processing unit configured to process a signal obtained by summing signals output from respective ones of the plurality of avalanche diodes,
wherein the quench element, the number of which is one, is connected to the plurality of avalanche diodes in series, and
wherein first regions each including one of the plurality of avalanche diodes and a second region including the quench element are arranged in a matrix on the substrate to form rows and columns.

12. The photo-detection device according to claim 11, wherein the second region further includes an avalanche diode having an area smaller than an area of an avalanche diode included in each of the first regions.

13. The photo-detection device according to claim 11, wherein the second region includes no avalanche diode.

14. A photo-detection device comprising:
a plurality of avalanche diodes;
a quench element configured to suppress avalanche multiplication in the plurality of avalanche diodes; and
a pixel signal processing unit configured to process a signal obtained by summing signals output from respective ones of the plurality of avalanche diodes,
wherein the quench element, the number of which is one, is connected to the plurality of avalanche diodes in series,
wherein the plurality of avalanche diodes are formed on a first substrate, and
wherein the quench element is formed on a second substrate that is different from the first substrate.

* * * * *